United States Patent
Tsai et al.

(10) Patent No.: US 12,009,353 B2
(45) Date of Patent: Jun. 11, 2024

(54) OPTICAL DEVICE PACKAGE WITH COMPATIBLE LID AND CARRIER

(71) Applicant: Advanced Semiconductor Engineering, Inc., Kaohsiung (TW)

(72) Inventors: Tsung-Yueh Tsai, Kaohsiung (TW); Meng-Jen Wang, Kaohsiung (TW); Yu-Fang Tsai, Kaohsiung (TW); Meng-Jung Chuang, Kaohsiung (TW)

(73) Assignee: ADVANCED SEMICONDUCTOR ENGINEERING, INC., Kaohsiung (TW)

( * ) Notice: Subject to any disclaimer, the term of this patent is extended or adjusted under 35 U.S.C. 154(b) by 0 days.

(21) Appl. No.: 17/719,280

(22) Filed: Apr. 12, 2022

(65) Prior Publication Data
US 2022/0238502 A1    Jul. 28, 2022

Related U.S. Application Data

(63) Continuation of application No. 16/664,652, filed on Oct. 25, 2019, now Pat. No. 11,302,682.

(51) Int. Cl.
| | |
|---|---|
| *H01L 25/16* | (2023.01) |
| *H01L 21/48* | (2006.01) |
| *H01L 21/52* | (2006.01) |
| *H01L 23/31* | (2006.01) |
| *H01L 23/538* | (2006.01) |

(52) U.S. Cl.
CPC ........ *H01L 25/167* (2013.01); *H01L 21/4817* (2013.01); *H01L 21/52* (2013.01); *H01L 23/3128* (2013.01); *H01L 23/5386* (2013.01); *H01L 23/5389* (2013.01); *H01L 25/165* (2013.01)

(58) Field of Classification Search
CPC . H01L 21/4817; H01L 21/52; H01L 23/3128; H01L 25/165; H01L 25/167
See application file for complete search history.

(56) References Cited

U.S. PATENT DOCUMENTS

| | | | |
|---|---|---|---|
| 9,643,838 B1 | 5/2017 | Chu et al. | |
| 10,720,751 B2 | 1/2020 | Tsai et al. | |
| 2005/0189635 A1 | 9/2005 | Humpston et al. | |
| 2011/0074048 A1 | 3/2011 | Shibita et al. | |
| 2013/0270584 A1* | 10/2013 | Tong ............... | H01L 33/0095 438/66 |
| 2013/0313005 A1 | 11/2013 | Nakamura et al. | |

(Continued)

FOREIGN PATENT DOCUMENTS

| | | | |
|---|---|---|---|
| EP | 3340291 A1 * | 6/2018 | ............ H01L 21/52 |
| TW | 201406238 A | 2/2014 | |

(Continued)

OTHER PUBLICATIONS

Non-Final Office Action for U.S. Appl. No. 16/664,652, dated Jun. 16, 2021, 10 pages.

(Continued)

*Primary Examiner* — Suberr L Chi
(74) *Attorney, Agent, or Firm* — FOLEY & LARDNER LLP

(57) ABSTRACT

An optical device package comprises a carrier having a first surface and a second surface recessed with respect to the first surface and a lid disposed on the second surface of the carrier.

7 Claims, 18 Drawing Sheets

(56) References Cited

U.S. PATENT DOCUMENTS

| | | | |
|---|---|---|---|
| 2014/0061893 A1 | 3/2014 | Saeidi et al. | |
| 2015/0028357 A1 | 1/2015 | Tu et al. | |
| 2018/0188105 A1 | 7/2018 | Huang | |
| 2019/0139947 A1* | 5/2019 | Saxod | ................... B29C 69/001 |

FOREIGN PATENT DOCUMENTS

| | | |
|---|---|---|
| TW | 201428982 A | 7/2014 |
| TW | 201505135 A | 2/2015 |
| TW | 201739686 A | 11/2017 |
| TW | 201924016 A | 6/2019 |
| TW | I671872 B | 9/2019 |

OTHER PUBLICATIONS

Notice of Allowance for U.S. Appl. No. 16/664,652, dated, Dec. 8, 2021, 11 pages.
Office Action from corresponding Taiwan Patent Application No. 109136216, dated May 23, 2022, 5 pages.
Search Report with English translation from corresponding Taiwan Patent Application No. 109136216, dated May 23, 2022, 2 pages.
Office Action from corresponding Taiwan Patent Application No. 109136216, dated Jul. 15, 2022, 5 pages.
Search Report with English translation from corresponding Taiwan Patent Application No. 109136216, dated Jul. 15, 2022, 2 pages.
Office Action for corresponding Taiwan Patent Application No. 11114270, dated Nov. 28, 2023, 6 pages.
Search Report with English translation for corresponding Taiwan Patent Application No. 11114270, dated Nov. 28, 2023, 3 pages.

* cited by examiner

OPTICAL DEVICE PACKAGE WITH COMPATIBLE LID AND CARRIER

CROSS-REFERENCE TO RELATED APPLICATION

This application is a continuation of U.S. patent application Ser. No. 16/664,652 filed Oct. 25, 2019, the contents of which is incorporated herein by reference in its entirety.

BACKGROUND

1. Technical Field

The instant disclosure relates to an optical device package, and more particularly, to a package structure with a low manufacturing cost and a confidential performance.

2. Description of Related Art

An optical device package can include some semiconductor devices on a carrier. Some of the semiconductor devices can be integrated or embedded into the carrier for miniaturization. However, cost of integrating or embedding the semiconductor devices into the carrier may be inevitably increased.

SUMMARY

In some embodiments, an optical device package comprises a carrier and a lid. The carrier comprises a first surface and a second surface recessed with respect to the first surface. The lid is disposed on the second surface of the carrier.

In some embodiments, an optical device package comprises a carrier and a lid. The carrier comprises a first surface and a second surface. The lid comprises a first surface supported by the second surface of the carrier. The first surface of the carrier and the first surface of the lid are not lying in s same plane.

In some embodiments, a method of manufacturing an optical device package comprises: providing a carrier; removing a portion of the carrier such that the carrier has a first surface and a second surface recessed with respect to the first surface, and disposing a lid on the second surface of the carrier.

Figure 1:
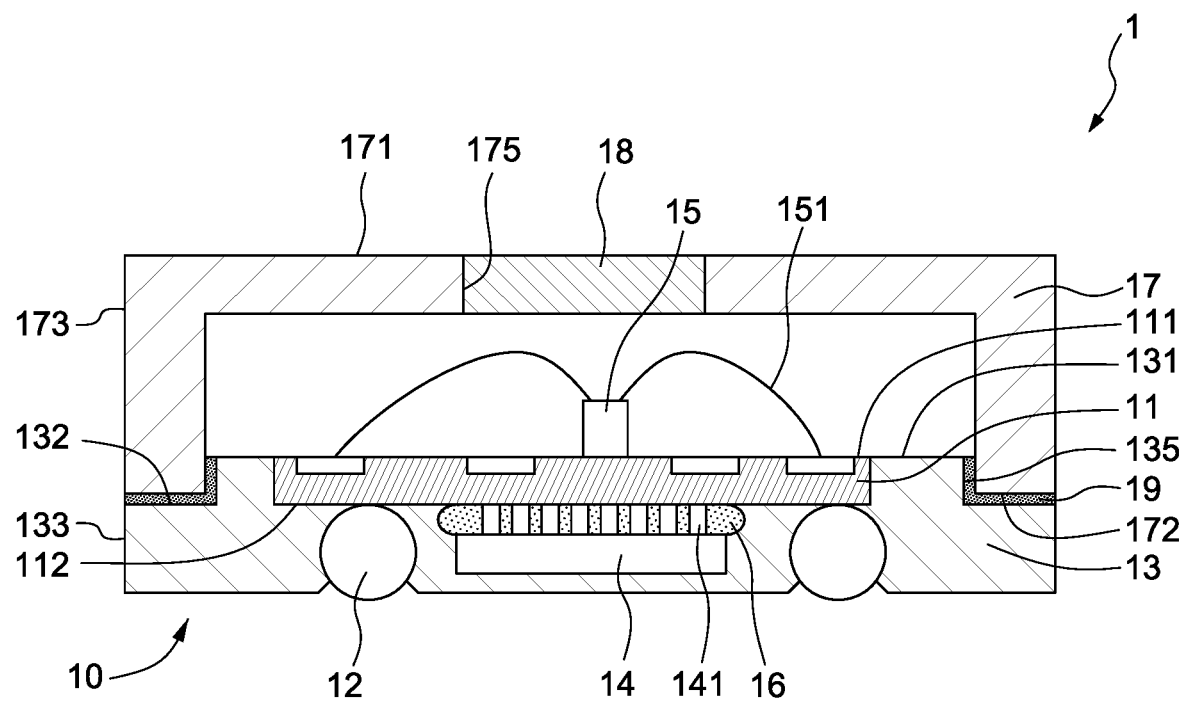
FIG. 1 illustrates a cross-sectional view of an optical device package in accordance with some embodiments of the present disclosure.

Common reference numerals are used throughout the drawings and the detailed description to indicate the same or similar components. The present disclosure will be more apparent from the following detailed description taken in conjunction with the accompanying drawings.

DETAILED DESCRIPTION

The aforementioned illustrations and following detailed descriptions are by example for the purpose of further explaining the scope of the instant disclosure. Other objectives and advantages related to the instant disclosure will be illustrated in the subsequent descriptions and appended drawings.

Spatial descriptions, such as "above," "below," "up," "left," "right," "down," "top," "bottom," "vertical," "horizontal," "side," "higher," "lower," "upper," "over," "under," and so forth, are indicated with respect to the orientation shown in the figures unless otherwise specified. It should be understood that the spatial descriptions used herein are for purposes of illustration, and that practical implementations of the structures described herein can be spatially arranged in any orientation or manner, provided that the merits of embodiments of this disclosure are not deviated by such arrangement.

FIG. 1 illustrates a cross-sectional view of an optical device package 1 in accordance with some embodiments of the present disclosure. The optical device package 1 comprises a carrier 10 and a lid 17. In some embodiments, the carrier 10 may include ceramic material or a metal plate. In some embodiments, the carrier 10 may be a substrate, an organic substrate or a leadframe. In some embodiment, the carrier 10 may include a plurality of traces. The carrier 10 illustrated in FIG. 1 comprises a redistribution structure 11, electrical connections 12, an encapsulant 13, a semiconductor device 14, an optical element 15 and an under-fill layer 16.

The redistribution structure 11 has a surface 111 and a surface 112 opposite the surface 111. At least one of the electrical connections 12 is on the surface 112 of the redistribution structure 11. The encapsulant 13 encapsulates the surface 112 and the side surface 113 of the redistribution structure 11 and the electrical connections 12. A portion of each electrical connection 12 is exposed by the encapsulant 13.

The semiconductor device 14 is mounted on the surface 112 of the redistribution structure 11. The semiconductor device 14 and the redistribution structure 11 are electrically connected by the bumps 141. In some embodiments, the space between the bumps 141 is filled with an under-fill layer 16. The electrical connections 12 surround a periphery of the semiconductor device 14 and are used to fan-out the inputs and outputs of the semiconductor device 14. The optical element 15 (e.g., optical emitter or optical detector) is mounted on and electrically connected to the surface 111 of the redistribution structure 11.

As shown in FIG. 1, the encapsulant 13 encapsulates the surface 112 and the side surface 113 of the redistribution structure 11 and the electrical connections 12. The encapsulant 13 has a surface 131, a surface 132 recessed with respect to the surface 131 and a surface 135 connecting the surface 131 and 132. The surface 131 of the encapsulant 13 may be substantially coplanar with the surface 111 of the redistribution structure 11, and thus the surface 132 of the encapsulant 13 is elevationally less than the surface 131 of the encapsulant 13 and the surface 111 of the redistribution structure 11. In addition, the surface 132 is adjacent to the side surface 133 of the encapsulant 13.

Given the above, referring to FIG. 1, the carrier 10 has a recessed portion at its side, which is formed by the surfaces 132 and 135.

Further, a lid 17 is arranged on the carrier 10. Referring to FIG. 1, the lid 17 is disposed on the surface 132 of the encapsulant 13 by the adhesive 19. The adhesive 19 may be the optical glue and the optical density (OD) value of the optical glue is greater than 3. Especially, as shown in to FIG. 1, the adhesive 19 is substantially arranged on the surface 132 of the encapsulant 13 and the side surface 135 of the encapsulant 13 which is connected to the surfaces 131 and 132 of the encapsulant 13. That is, the adhesive 19 is arranged at the recessed portion of the carrier 10 and is substantially between the lid 17 and the carrier 10. Moreover, since the adhesive 19 is arranged at the recessed portion of the carrier 10, the adhesive 19 may not bleed on the surface 131 and the surface 111 to cover the wire 151. The wire 151 is not pulled and dragged by the adhesive 19 during the assembly process, e.g., heating or curing process. The lid 17 has a surface 172 supported by the surface 132 of the encapsulant 13. Thus, the surface 172 of the lid 17 is elevationally less than the surface 131 of the encapsulant 13 and the surface 111 of the redistribution structure 11. In other words, the surface 172 of the lid 17 and the surface 131 of the encapsulant 13 and the surface 111 of the redistribution structure 11 are disposed in different elevations. In some embodiments, the surface 173 of the lid 17 and the side surface 133 of the encapsulant 13 may not be coplanar with each other.

The lid 17 has an aperture 175 at its top and the aperture 175 is substantially aligned with the optical element 15. A filter material 18 is arranged within the aperture 175. Moreover, since the lid 17 may be formed by injection molding, the roughness of the outer surface of the lid 17 may be substantially unified. That is, the roughness of the side surface 173 of the lid 17 may be identical to the roughness of the top surface 171 of the lid 17.

Figure 2:
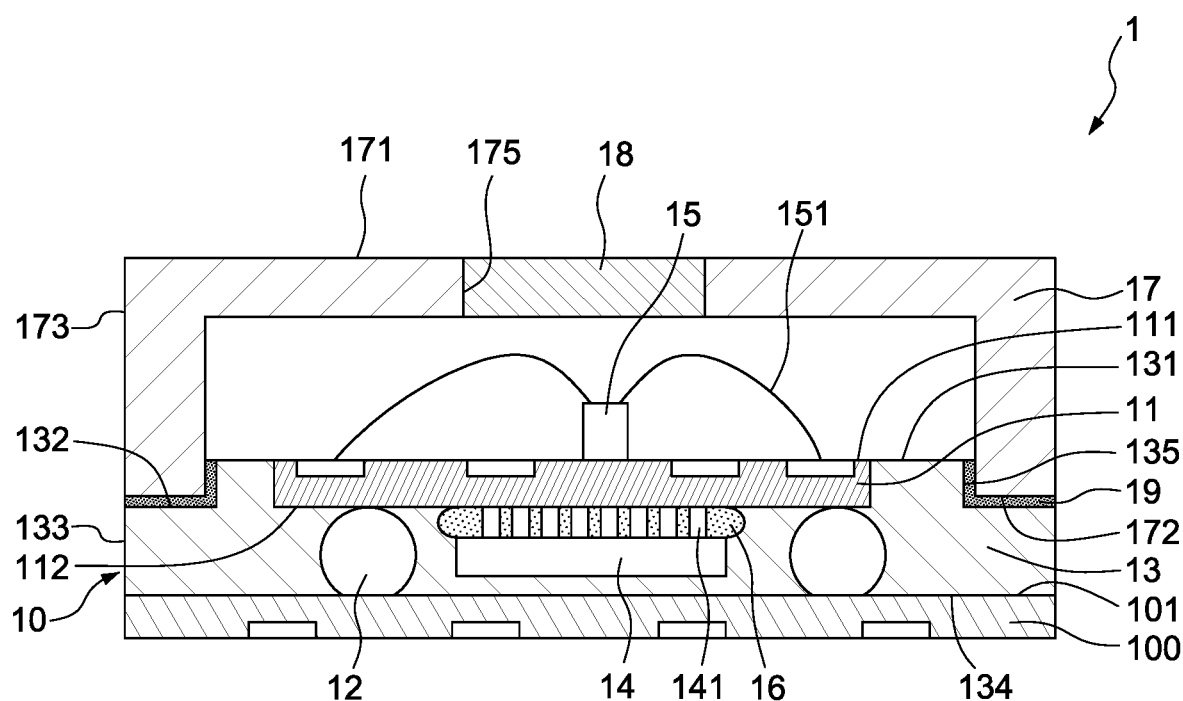
FIG. 2 illustrates a cross-sectional view of an optical device package in accordance with some embodiments of the present disclosure.

FIG. 2 illustrates a cross-sectional view of an optical device package 1 in accordance with some embodiments of the present disclosure. The optical device package 1 shown in FIG. 2 is similar in certain respects to the optical device package 1 shown in FIG. 1, except that in FIG. 2, a substrate 100 is attached to the surface 134 of the encapsulant 13, which is opposite the surface 131 of the encapsulant 13, and electrically connected to the electrical connections 12. In addition, the electrical connections 12 may not be exposed. Thus, in at least some embodiments, the optical device package 1 further comprises a substrate 100, and the encapsulant 13 encapsulates the surface 112 and the side surfaces 113 of the redistribution structure 11, the surface 101 of the substrate 100 and the electrical connections 12.

Figure 3:
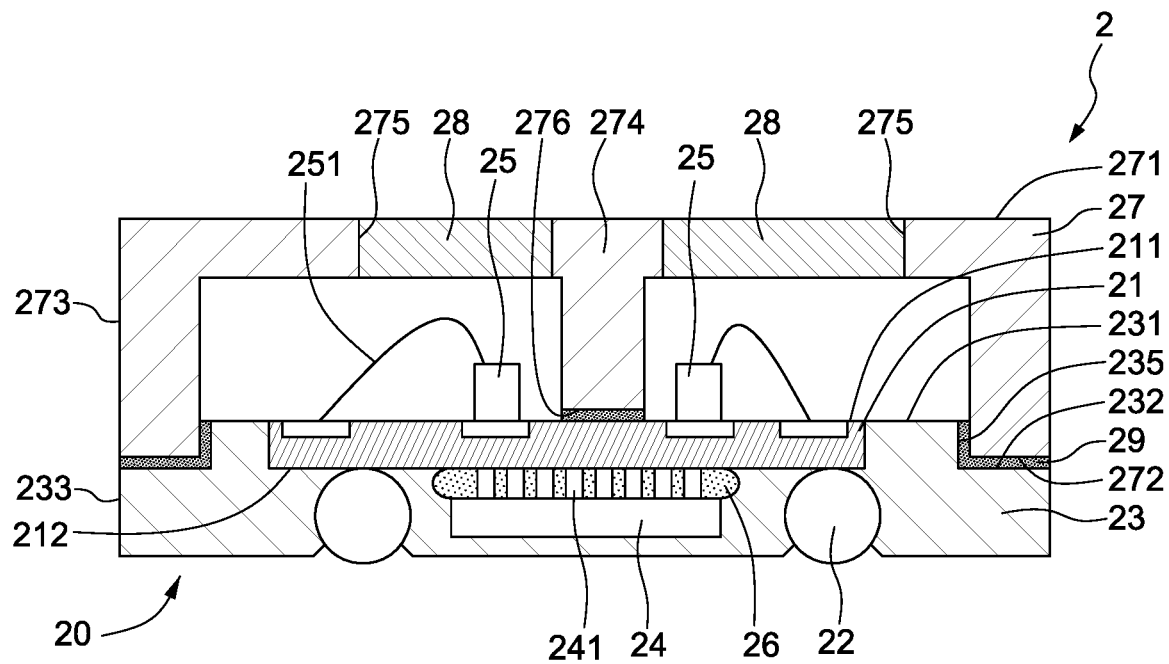
FIG. 3 illustrates a cross-sectional view of an optical device package in accordance with some embodiments of the present disclosure.

FIG. 3 illustrates a cross-sectional view of an optical device package 2 in accordance with some embodiments of the present disclosure. The optical device package 2 comprises a carrier 20 and a lid 27. In some embodiments, the carrier 20 may include ceramic material or a metal plate. In some embodiments, the carrier 20 may be a substrate, an organic substrate or a leadframe. In some embodiment, the carrier 20 may include a plurality of traces. The carrier 20 illustrated in FIG. 3 comprises a redistribution structure 21, electrical connections 22, an encapsulant 23, a semiconductor device 24, optical elements 25 and an under-fill layer 26.

The redistribution structure 21 has a surface 211 and a surface 212 opposite the surface 211. At least one of the electrical connections 22 is on the surface 212 of the redistribution structure 21. The encapsulant 23 encapsulates the surface 212 and the side surface 213 of the redistribution structure 21 and the electrical connections 22. A portion of each electrical connection 22 is exposed by the encapsulant 23.

The semiconductor device 24 is mounted on the surface 212 of the redistribution structure 21. The semiconductor device 24 and the redistribution structure 21 are electrically connected by the bumps 241. In some embodiments, the space between the bumps 241 is filled with an under-fill layer 26. The electrical connections 22 surround a periphery of the semiconductor device 24 and are used to fan-out the inputs and outputs of the semiconductor device 24. The optical elements 25 are mounted on and electrically connected to the surface 211 of the redistribution structure 21. Regarding these two optical elements 25, they may be two optical emitters or two optical detectors or one is an optical emitter and the other is an optical detector.

As shown in FIG. 3, the encapsulant 23 encapsulates the surface 212 and the side surface 213 of the redistribution structure 21 and the electrical connections 22. The encapsulant 23 has a surface 231, a surface 232 recessed with respect to the surface 231 and a surface 235 connecting the surfaces 231 and 232. The surface 231 of the encapsulant 23 may be substantially coplanar with the surface 211 of the redistribution structure 21, and thus the surface 232 of the encapsulant 23 is elevationally less than the surface 231 of the encapsulant 23 and the surface 211 of the redistribution structure 21. In addition, the surface 232 is adjacent to the side surface 233 of the encapsulant 23.

Given the above, referring to FIG. 3, the carrier 20 has a recessed portion at its side, which is formed by the surfaces 232 and 235.

Further, a lid 27 is arranged on the carrier 10. Referring to FIG. 3, the lid 27 is disposed on the surface 211 of the redistribution structure 21 and the surface 232 of the encapsulant 23 by the adhesive 29. The adhesive 29 may be the optical glue and the optical density (OD) value of the optical glue is greater than 3. Especially, as shown in to FIG. 3, the adhesive 29 is substantially arranged on the surface 232 of the encapsulant 23 and the side surface 235 of the encapsulant 23 which is connected to the surfaces 231 and 232 of the encapsulant 23 and arranged on the first surface 211 of the redistribution structure 21. That is, the adhesive 29 is arranged at the recessed portion of the carrier 20 and is substantially between the lid 27 and the carrier 20. Moreover, since the adhesive 29 is arranged at the recessed portion of the carrier 20, the adhesive 29 may not bleed on the surface 231 and the surface 211 to cover the wire 251. The wire 251 is not pulled and dragged by the adhesive 29 during the assembly process, e.g., heating or curing process. The lid 27 has a surface 272 supported by the surface 232 of the encapsulant 23. Thus, the surface 272 of the lid 27 is elevationally less than the surface 231 of the encapsulant 13 and the surface 211 of the redistribution structure 21. In other words, the surface 272 of the lid 27 and the surface 231 of the encapsulant 23 and the surface 211 of the redistribution structure 21 are disposed in the different elevations. In addition, the lid 27 may have an inner wall 274 which isolates the optical elements 25 from each other. The inner wall 274 of the lid 27 has a surface 276 supported by the surface 211 of the redistribution structure 21. Thus, the surface 272 is elevationally less than the surface 276. That is, the surfaces 272 and 276 of the lid 27 are disposed in different elevations. In some embodiments, the surface 273 of the lid 27 and the side surface 233 of the encapsulant 23 may not be coplanar with each other.

The lid 27 has two apertures 275 at its top and each of the apertures 275 is substantially aligned with the optical element 25. Further, the filter materials 28 are respectively arranged within the aperture 275. Moreover, since the lid 27 may be formed by injection molding, the roughness of the outer surface of the lid 27 may be substantially unified. That is, the roughness of the side surface 273 of the lid 27 may be identical to the roughness of the top surface 271 of the lid 27.

Figure 4:
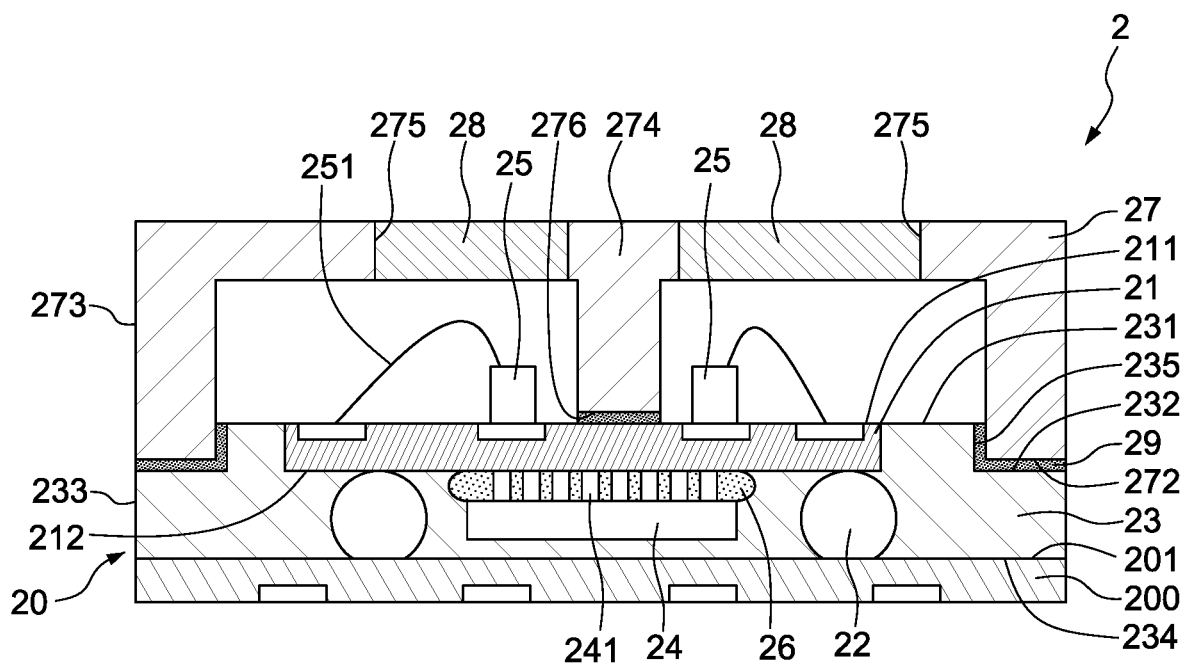
FIG. 4 illustrates a cross-sectional view of an optical device package in accordance with some embodiments of the present disclosure.

FIG. 4 illustrates a cross-sectional view of an optical device package 2 in accordance with some embodiments of the present disclosure. The optical device package 2 shown in FIG. 4 is similar in certain respects to the optical device package 2 shown in FIG. 3, except that in FIG. 4, the substrate 200 is attached to the surface 234 of the encapsulant 23, which is opposite the surface 231 of the encapsulant 23, and electrically connected to the electrical connections 22. In addition, the electrical connections 22 may not be exposed. Thus, in at least some embodiments, the optical device package 2 further comprises a substrate 200, and the encapsulant 23 encapsulates the surface 212 and the side surfaces 213 of the redistribution structure 21, the surface 201 of the substrate 200 and the electrical connections 22.

Figure 5:
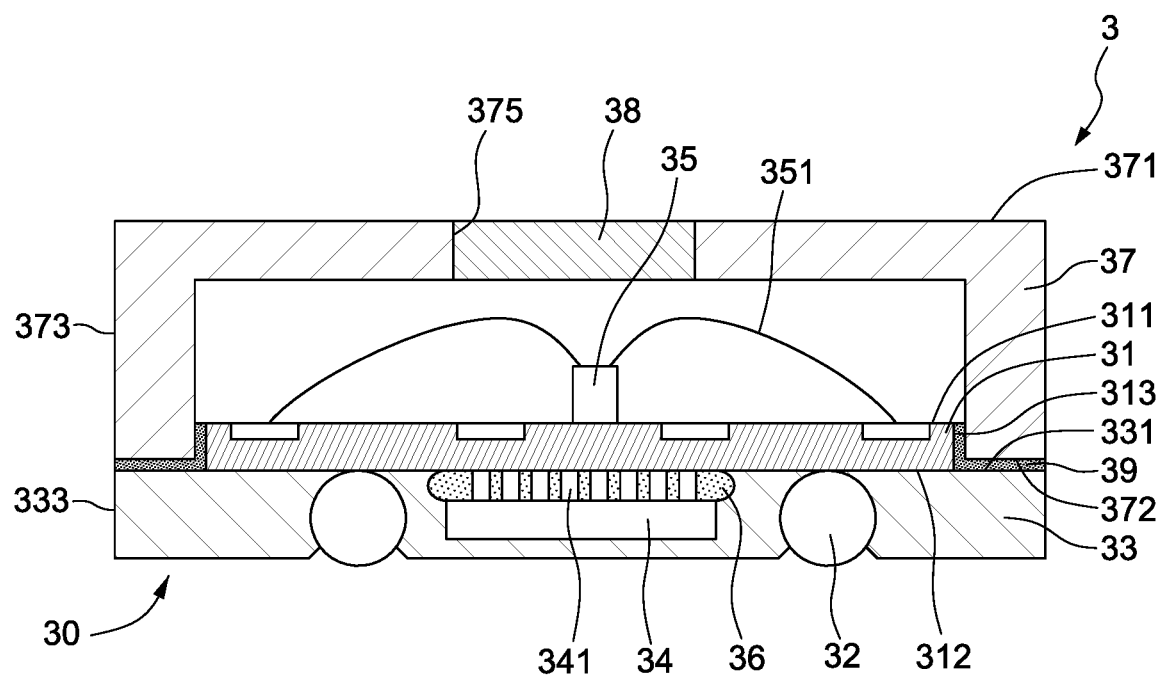
FIG. 5 illustrates a cross-sectional view of an optical device package in accordance with some embodiments of the present disclosure.

FIG. 5 illustrates a cross-sectional view of an optical device package 3 in accordance with some embodiments of the present disclosure. The optical device package 3 comprises a carrier 30 and a lid 37. In some embodiments, the carrier 30 may include ceramic material or a metal plate. In some embodiments, the carrier 30 may be a substrate, an organic substrate or a leadframe. In some embodiment, the carrier 30 may include a plurality of traces. The carrier 30 illustrated in FIG. 5 comprises a redistribution structure 31, electrical connections 32, an encapsulant 33, a semiconductor device 34, an optical element 35 and an under-fill layer 36.

The redistribution structure 31 has a surface 311 and a surface 312 opposite the surface 311. At least one of the electrical connections 32 is on the surface 312 of the redistribution structure 31. The encapsulant 33 encapsulates the surface 312 of the redistribution structure 31 and the electrical connections 32. A portion of each electrical connection 32 is exposed by the encapsulant 33. In addition, the redistribution structure 31 has a side surface 313, and some plating lines may be exposed on the side surface 313.

The semiconductor device 34 is mounted on the surface 312 of the redistribution structure 31. The semiconductor device 34 and the redistribution structure 31 are electrically connected by the bumps 341. In some embodiments, the space between the bumps 341 is filled with an under-fill layer 36. The electrical connections 32 surround a periphery of the semiconductor device 34 and are used to fan-out the inputs and outputs of the semiconductor device 34. The optical element 35 (e.g., optical emitter or optical detector) is mounted on and electrically connected to the surface 311 of the redistribution structure 31.

As shown in FIG. 5, the encapsulant 33 encapsulates the surface 312 of the redistribution structure 31 and the electrical connections 32. Thus, the encapsulant 33 has a surface 331 recessed with respect to the surface 311 of the redistribution structure 31 and adjacent to the side surface 313 of the redistribution structure 31. That is, the surface 331 of the encapsulant 33 is elevationally less than the surface 311 of the redistribution structure 31. In addition, the surface 331 of the encapsulant 33 may be coplanar with the surface 312 of the redistribution structure 31.

Given the above, referring to FIG. 5, the carrier 30 has a recessed portion at its side, which is formed by the surfaces 331 and 313.

Further, a lid 37 is arranged on the carrier 30. Referring to FIG. 5, the lid 37 is disposed on the surface 331 of the encapsulant 13 by the adhesive 39. The adhesive 39 may be the optical glue and the optical density (OD) value of the optical glue is greater than 3. Especially, as shown in to FIG. 5, the adhesive 39 is substantially arranged on the surface 331 of the encapsulant 33 and the side surface 313 of the redistribution structure 31, which connects the surface 311 of the redistribution structure 31 and the surface 331 of the encapsulant 33. That is, the adhesive 39 is arranged at the recessed portion of the carrier 30 and is substantially between the lid 37 and the carrier 30. Moreover, since the adhesive 39 is arranged at the recessed portion of the carrier 30, the adhesive 39 may not bleed on the surface 311 to cover contact the wire 351. The wire 351 is not pulled and dragged by the adhesive 39 during the assembly process, e.g., heating or curing process. The lid 37 has a surface 372 supported by the surface 332 of the encapsulant 33. Thus, the surface 372 of the lid 37 is elevationally less than the surface 311 of the redistribution structure 31. In other words, the surface 372 of the lid 37 and the surface 311 of the redistribution structure 31 are disposed in different elevations. In some embodiments, the surface 373 of the lid 37 and the side surface 333 of the encapsulant 33 may not be coplanar with each other.

The lid 37 has an aperture 375 at its top and the aperture 375 is substantially aligned with the optical element 35. A filter material 38 is arranged within the aperture 375. Moreover, since the lid 37 may be formed by injection molding, the roughness of the outer surface of the lid 37 may be substantially unified. That is, the roughness of the side surface 373 of the lid 37 may be identical to the roughness of the top surface 371 of the lid 37.

Figure 6:
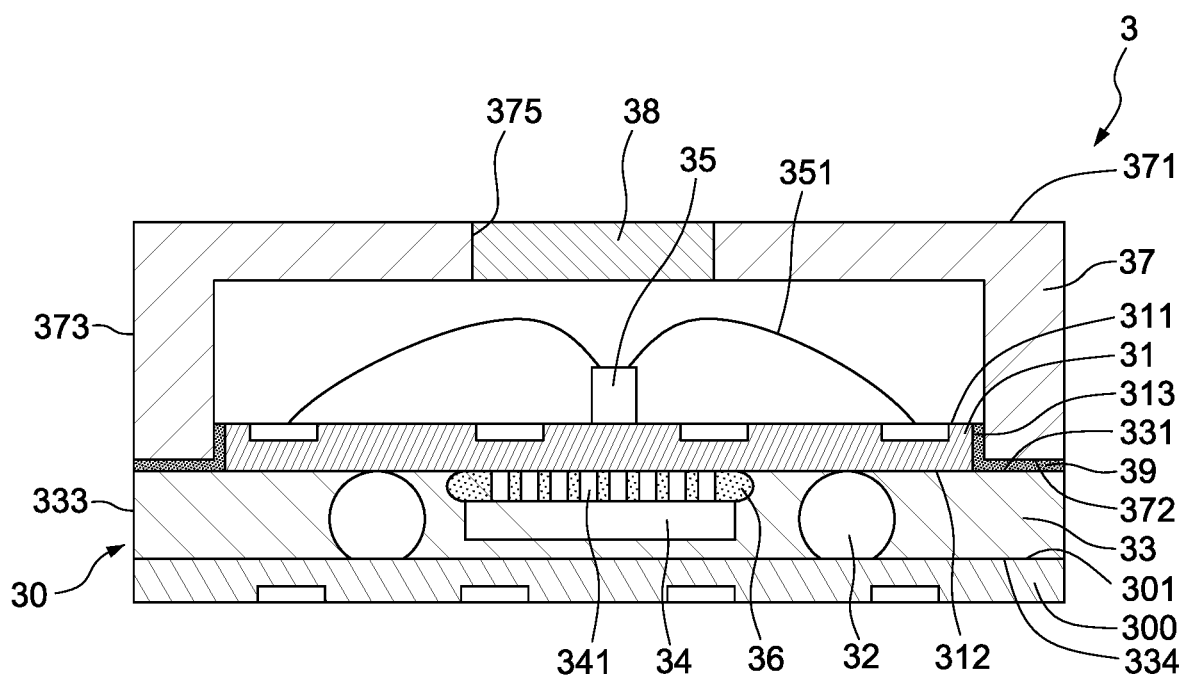
FIG. 6 illustrates a cross-sectional view of an optical device package in accordance with some embodiments of the present disclosure.

FIG. 6 illustrates a cross-sectional view of an optical device package 3 in accordance with some embodiments of the present disclosure. The optical device package 3 shown in FIG. 6 is similar in certain respects to the optical device package 3 shown in FIG. 5, except that in FIG. 6, a substrate 300 is attached to the surface 334 of the encapsulant 33, which is opposite the surface 331 of the encapsulant 33, and electrically connected to the electrical connections 32. In addition, the electrical connections 32 may not be exposed. Thus, in at least some embodiments, the optical device package 3 further comprises a substrate 300, and the encapsulant 33 encapsulates the surface 312 of the redistribution structure 31, the surface 301 of the substrate 300 and the electrical connections 32.

Figure 7:
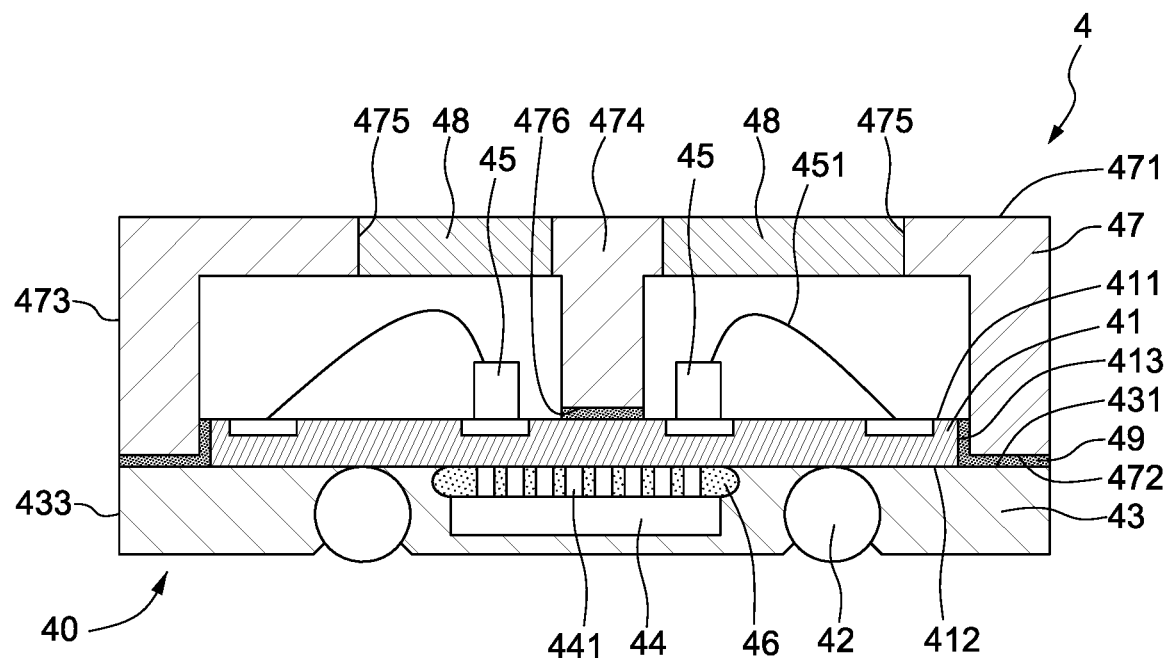
FIG. 7 illustrates a cross-sectional view of an optical device package in accordance with some embodiments of the present disclosure.

FIG. 7 illustrates a cross-sectional view of an optical device package 4 in accordance with some embodiments of the present disclosure. The optical device package 4 comprises a carrier 40 and a lid 47. In some embodiments, the carrier 40 may include ceramic material or a metal plate. In some embodiments, the carrier 40 may be a substrate, an organic substrate or a leadframe. In some embodiment, the carrier 40 may include a plurality of traces. The carrier 40 illustrated in FIG. 7 comprises a redistribution structure 41, electrical connections 42, an encapsulant 43, a semiconductor device 44, optical elements 45 and an under-fill layer 46.

The redistribution structure 41 has a surface 411 and a surface 412 opposite the surface 411. At least one of the electrical connections 42 is on the surface 412 of the redistribution structure 41. The encapsulant 43 encapsulates the surface 412 of the redistribution structure 41 and the electrical connections 42. A portion of each electrical connection 42 is exposed by the encapsulant 43. In addition, the redistribution structure 41 has a side surface 413, and some plating lines may be exposed on the side surface 413.

The semiconductor device 44 is mounted on the surface 412 of the redistribution structure 41. The semiconductor device 44 and the redistribution structure 41 are electrically connected by the bumps 441. In some embodiments, the space between the bumps 441 is filled with an under-fill layer 46. The electrical connections 42 surround a periphery of the semiconductor device 44 and are used to fan-out the inputs and outputs of the semiconductor device 44. The optical elements 45 are mounted on and electrically connected to the surface 411 of the redistribution structure 41. Regarding these two optical elements 45, they may be two optical emitters or two optical detectors or one is an optical emitter and the other is an optical detector.

As shown in FIG. 7, the encapsulant 43 encapsulates the surface 412 of the redistribution structure 41 and the electrical connections 42. The encapsulant 43 has a surface 431 recessed with respect to the surface 411 of the redistribution structure 41 and adjacent to the side surface 413 of the redistribution structure 41. Thus, the surface 431 of the encapsulant 43 is elevationally less than the surface 411 of the redistribution structure 41. In addition, the surface 431 of the encapsulant 43 may be coplanar with the surface 412 of the redistribution structure 41.

Given the above, referring to FIG. 7, the carrier 40 has a recessed portion at its side, which is formed by the surfaces 431 and 413.

Further, a lid 47 is arranged on the carrier 40. Referring to FIG. 7, the lid 47 is disposed on the surface 411 of the redistribution structure 41 and the surface 431 of the encapsulant 43 by the adhesive 49. The adhesive 49 may be the optical glue and the optical density (OD) value of the optical glue is greater than 3. Especially, as shown in to FIG. 7, the adhesive 49 is substantially arranged on the surface 431 of the encapsulant 43 and the side surface 413 of the redistribution structure 41, which connects to the surface 411 of the redistribution structure 41 and the surface 431 of the encapsulant 43, and arranged on the surface 411 of the redistribution structure 41. That is, the adhesive 49 is arranged at the recessed portion of the carrier 47 and is substantially between the lid 47 and the carrier 40. Moreover, since the adhesive 49 is arranged at the recessed portion of the carrier 40, the adhesive 49 may not bleed on the surface 411 to cover the wire 451. The wire 451 is not pulled and dragged by the adhesive 49 during the assembly process, e.g., heating or curing process. The lid 47 has a surface 472 supported by the surface 431 of the encapsulant 43. Thus, the surface 472 of the lid 47 is elevationally less than the surface 431 of the encapsulant 43. In other words, the surface 472 of the lid 47 and the surface 411 of the redistribution structure 41 are disposed in the different elevations. In addition, the lid 47 may have an inner wall 474 which isolates the optical elements 45 from each other. The inner wall 474 of the lid 47 has a surface 476 supported by the surface 411 of the redistribution structure 41. Thus, the surface 472 is elevationally less than the surface 476. That is, the surfaces 472 and 476 of the lid 47 are disposed in different elevations. In some embodiments, the surface 473 of the lid 47 and the side surface 433 of the encapsulant 43 may not be coplanar with each other.

The lid 47 has two apertures 475 at its top and each of the apertures 475 is substantially aligned with the optical elements 45. Further, the filter materials 48 are respectively arranged within the aperture 475. Moreover, since the lid 47 may be formed by injection molding, the roughness of the outer surface of the lid 47 may be substantially unified. That is, the roughness of the side surface 473 of the lid 47 may be identical to the roughness of the top surface 471 of the lid 47.

Figure 8:
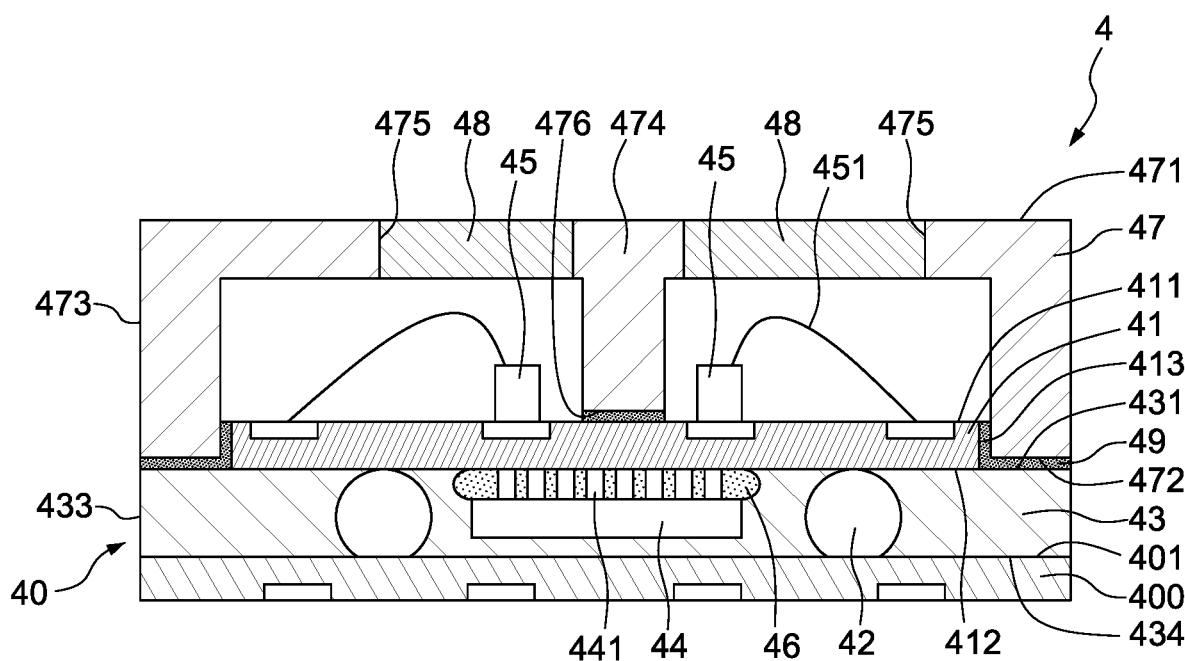
FIG. 8 illustrates a cross-sectional view of an optical device package in accordance with some embodiments of the present disclosure.

FIG. 8 illustrates a cross-sectional view of an optical device package 4 in accordance with some embodiments of the present disclosure. The optical device package 4 shown in FIG. 8 is similar in certain respects to the optical device package 4 shown in FIG. 7, except that in FIG. 8, a substrate 400 is attached to the surface 434 of the encapsulant 43, which is opposite the surface 431 of the encapsulant 43, and electrically connected to the electrical connections 42. In addition, the electrical connections 42 may not be exposed. Thus, in at least some embodiments, the optical device package 4 further comprises a substrate 400, and the encapsulant 43 encapsulates the surface 412 of the redistribution structure 41, the surface 401 of the substrate 400 and the electrical connections 42.

Figure 9:
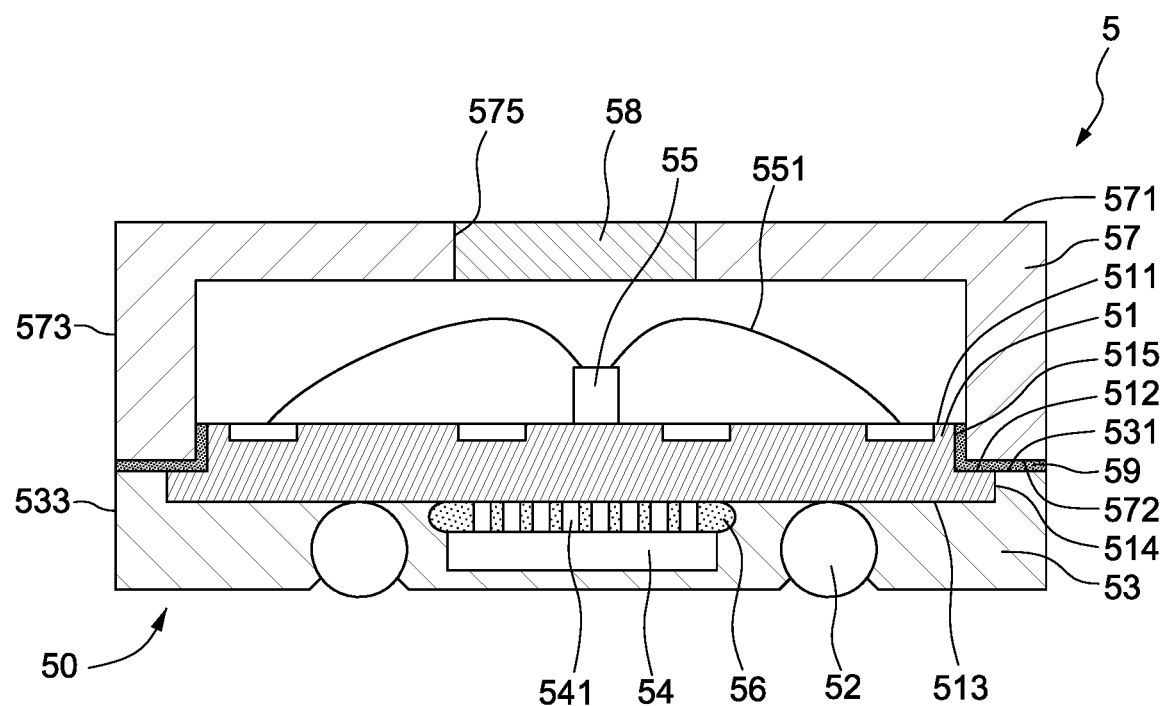
FIG. 9 illustrates a cross-sectional view of an optical device package in accordance with some embodiments of the present disclosure.

FIG. 9 illustrates a cross-sectional view of an optical device package 5 in accordance with some embodiments of the present disclosure. The optical device package 5 comprises a carrier 50 and a lid 57. In some embodiments, the carrier 50 may include ceramic material or a metal plate. In some embodiments, the carrier 50 may be a substrate, an organic substrate or a leadframe. In some embodiment, the carrier 50 may include a plurality of traces. The carrier 50 illustrated in FIG. 9 comprises a redistribution structure 51, electrical connections 52, an encapsulant 53, a semiconductor device 54, an optical element 55 and an under-fill layer 56.

The redistribution structure 51 has a surface 511, a surface 512 recessed with respect to the 511, a surface 513 opposite the surfaces 511 and 512, a surface 514 connecting the surfaces 512 and 513 and a surface 515 connecting the surfaces 511 and 512. At least one of the electrical connections 52 is on the surface 513 of the redistribution structure 51. The encapsulant 53 encapsulates the surface 513 and the side surface 514 of the redistribution structure 51 and the electrical connections 52. A portion of each electrical connection 52 is exposed by the encapsulant 53. In addition, some plating lines may be exposed on the surface 515 of the redistribution structure 51.

The semiconductor device 54 is mounted on the surface 513 of the redistribution structure 51. The semiconductor device 54 and the redistribution structure 51 are electrically connected by the bumps 541. In some embodiments, the space between the bumps 541 is filled with an under-fill layer 56. The electrical connections 52 surround a periphery of the semiconductor device 54 and are used to fan-out the inputs and outputs of the semiconductor device 54. The optical element 55 (e.g., optical emitter or optical detector) is mounted on and electrically connected to the surface 511 of the redistribution structure 51.

As above-mentioned, the redistribution structure 51 has a surface 511, a surface 512 recessed with respect to the 511 and a surface 513 opposite the surfaces 511 and 512, and the encapsulant 53 encapsulates the surface 513 and the side surface 513 of the redistribution structure 51 and the electrical connections 52. The encapsulant 53 has a surface 531 which may be adjacent to and coplanar with the surface 512 of the redistribution structure 51. That is, the surface 512 of the redistribution structure 51 and the surface 531 of the encapsulant 53 is elevationally less than the surface 511 of the redistribution structure 51.

Given the above, referring to FIG. 9, the carrier 50 has a recessed portion at its side, which is formed by the surfaces 515, 512 and 531.

Further, a lid 57 is arranged on the carrier 50. Referring to FIG. 9, the lid 57 is disposed on the surface 512 of the redistribution structure 51 and the surface 531 of the encapsulant 53 by the adhesive 59. The adhesive 59 may be the optical glue and the optical density (OD) value of the optical glue is greater than 3. Especially, as shown in to FIG. 9, the adhesive 59 is substantially arranged on the surface 531 of the encapsulant 53, the surface 512 of the redistribution structure 51 and the side surface 515 of the redistribution structure 51 which is connected to the surfaces 511 and 512 of the redistribution structure 51. That is, the adhesive 59 is arranged at the recessed portion of the carrier 50 and is substantially between the lid 57 and the carrier 50. Moreover, since the adhesive 59 is arranged at the recessed portion of the carrier 50, the adhesive 59 may not bleed on the surface 511 to cover the wire 551. The wire 551 is not pulled and dragged by the adhesive 59 during the assembly process, e.g., heating or curing process. The lid 57 has a surface 572 supported by the surface 512 of the redistribution structure 51 and the surface 531 of the encapsulant 53. Thus, the surface 572 of the lid 57 is elevationally less than the surface 511 of the redistribution structure 51. In other words, the surface 572 of the lid 57 and the surface 511 of the redistribution structure 51 are disposed in different elevations. In some embodiments, the surface 573 of the lid 57 and the side surface 533 of the encapsulant 53 may not be coplanar with each other.

The lid 57 has an aperture 575 at its top and the aperture 575 is substantially aligned with the optical element 55. A filter material 58 is arranged within the aperture 575. Moreover, since the lid 57 may be formed by injection molding, the roughness of the outer surface of the lid 57 may be substantially unified. That is, the roughness of the side surface 573 of the lid 57 may be identical to the roughness of the top surface 571 of the lid 57.

Figure 10:
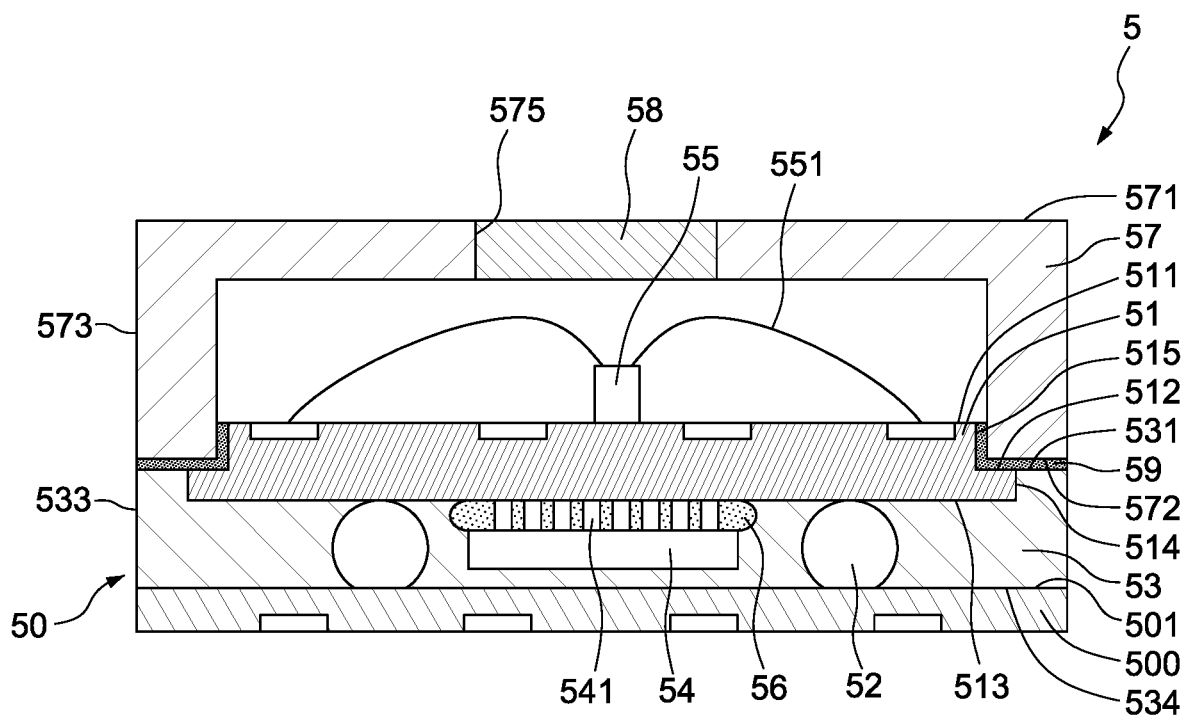
FIG. 10 illustrates a cross-sectional view of an optical device package in accordance with some embodiments of the present disclosure.

FIG. 10 illustrates a cross-sectional view of an optical device package 5 in accordance with some embodiments of the present disclosure. The optical device package 5 shown in FIG. 10 is similar in certain respects to the optical device package 5 shown in FIG. 9, except that in FIG. 10, a substrate 500 is attached to the surface 534 of the encapsulant 53, which is opposite the surface 531 of the encapsulant 53, and electrically connected to the electrical connections 52. In addition, the electrical connections 52 may not be exposed. Thus, in at least some embodiments, the optical device package 5 further comprises a substrate 500, and the encapsulant 53 encapsulates the surface 513 and the side surface 514 of the redistribution structure 51, the surface 501 of the substrate 500 and the electrical connections 52.

Figure 11:
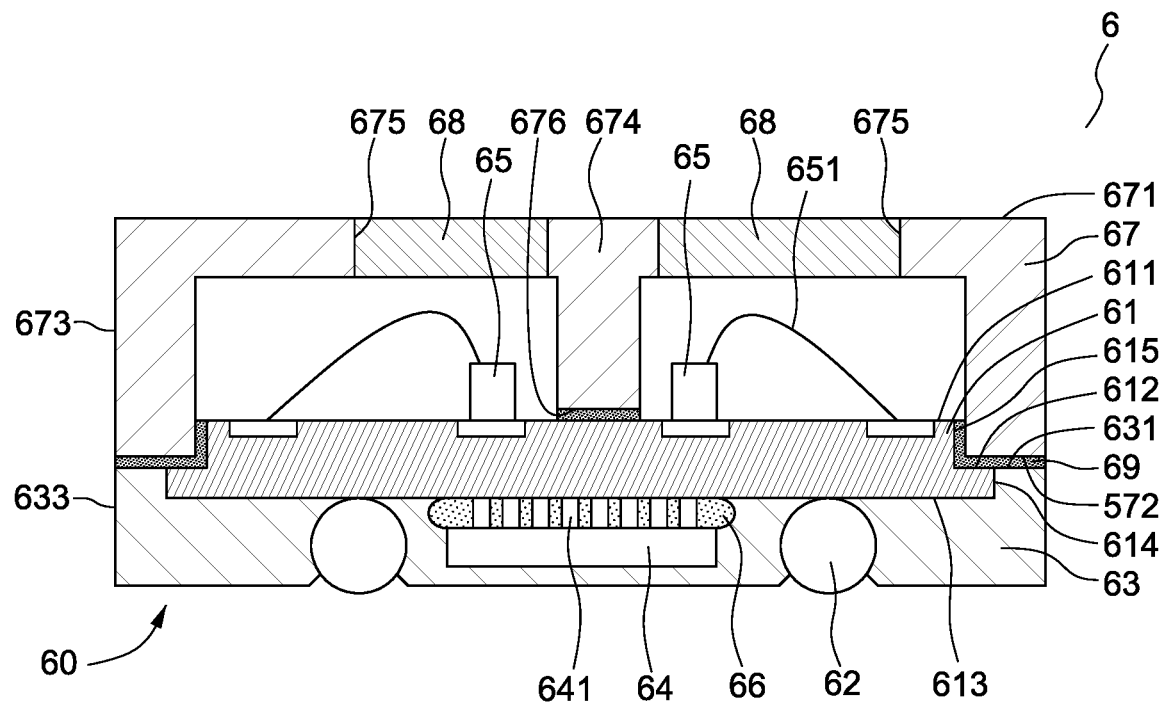
FIG. 11 illustrates a cross-sectional view of an optical device package in accordance with some embodiments of the present disclosure.

FIG. 11 illustrates a cross-sectional view of an optical device package 6 in accordance with some embodiments of the present disclosure. The optical device package 6 comprises a carrier 60 and a lid 67. In some embodiments, the carrier 60 may include ceramic material or a metal plate. In some embodiments, the carrier 60 may be a substrate, an organic substrate or a leadframe. In some embodiment, the carrier 60 may include a plurality of traces. The carrier 60 illustrated in FIG. 11 comprises a redistribution structure 61, electrical connections 62, an encapsulant 63, a semiconductor device 64, optical elements 65 and an under-fill layer 66.

The redistribution structure 61 has a surface 611, a surface 612 recessed with respect to the 611, a surface 613 opposite the surfaces 611 and 612, a surface 614 connecting the surfaces 612 and 613 and a surface 615 connecting the surfaces 611 and 612. At least one of the electrical connections 62 is on the surface 613 of the redistribution structure 51. The encapsulant 63 encapsulates the surface 613 and the side surface 614 of the redistribution structure 61 and the electrical connections 62. A portion of each electrical connection 62 is exposed by the encapsulant 63. In addition, some plating lines may be exposed on the surface 515 of the redistribution structure 51.

The semiconductor device 64 is mounted on the surface 613 of the redistribution structure 61. The semiconductor device 64 and the redistribution structure 61 are electrically connected by the bumps 641. In some embodiments, the space between the bumps 641 is filled with an under-fill layer 66. The electrical connections 62 surround a periphery of the semiconductor device 64 and are used to fan-out the inputs and outputs of the semiconductor device 64. The optical elements 65 are mounted on and electrically connected to the surface 611 of the redistribution structure 61. Regarding these two optical elements 65, they may be two optical emitters or two optical detectors or one is an optical emitter and the other is an optical detector.

As above-mentioned, the redistribution structure 61 has a surface 11, a surface 12 recessed with respect to the 611 and a surface 613 opposite the surfaces 611 and 612, and the encapsulant 63 encapsulates the surface 613 and the side surface 613 of the redistribution structure 61 and the electrical connections 62. The encapsulant 63 has a surface 631 which may be adjacent to and coplanar with the surface 612 of the redistribution structure 61. That is, the surface 612 of the redistribution structure 61 and the surface 631 of the encapsulant 63 is elevationally less than the surface 611 of the redistribution structure 61.

Given the above, referring to FIG. 11, the carrier 60 has a recessed portion at its side, which is formed by the surfaces 615, 612 and 631.

Further, a lid 67 is arranged on the carrier 60. Referring to FIG. 11, the lid 67 is disposed on the surface 611 of the redistribution structure 61, the surface 612 of the redistribution structure 61 and the surface 631 of the encapsulant 63 by the adhesive 69. The adhesive 69 may be the optical glue and the optical density (OD) value of the optical glue is greater than 3. Especially, as shown in to FIG. 11, the adhesive 69 is substantially arranged on the surface 611 of the redistribution structure 61, the surface 631 of the encapsulant 63, the surface 612 of the redistribution structure 61 and the side surface 615 of the redistribution structure 61 which is connected to the surfaces 611 and 612 of the redistribution structure 61. That is, the adhesive 69 is arranged at the recessed portion of the carrier 60 and is substantially between the lid 67 and the carrier 60. Moreover, since the adhesive 69 is arranged at the recessed portion of the carrier 60, the adhesive 69 may not bleed on the surface 611 to cover the wire 651. The wire 651 is not pulled and dragged by the adhesive 69 during the assembly process, e.g., heating or curing process. The lid 67 has a surface 672 supported by the surface 612 of the redistribution structure 61 and the surface 631 of the encapsulant 63. Thus, the surface 672 of the lid 67 is elevationally less than the surface 611 of the redistribution structure 61. In other words, the surface 672 of the lid 67 and the surface 611 of the redistribution structure 61 are disposed in different elevations. In addition, the lid 67 may have an inner wall 674 which isolates the optical elements 65 from each other. The inner wall 674 of the lid 67 has a surface 676 supported by the surface 611 of the redistribution structure 61. Thus, the surface 672 is elevationally less than the surface 676. That is, the surfaces 672 and 676 of the lid 67 are disposed in different elevations. In some embodiments, the surface 673 of the lid 67 and the side surface 633 of the encapsulant 63 may not be coplanar with each other.

The lid 67 has two apertures 675 at its top and each of the apertures 675 is substantially aligned with the optical elements 65. Further, the filter materials 68 are respectively arranged within the aperture 675. Moreover, since the lid 67 may be formed by injection molding, the roughness of the outer surface of the lid 67 may be substantially unified. That is, the roughness of the side surface 673 of the lid 67 may be identical to the roughness of the top surface 671 of the lid 67.

Figure 12:
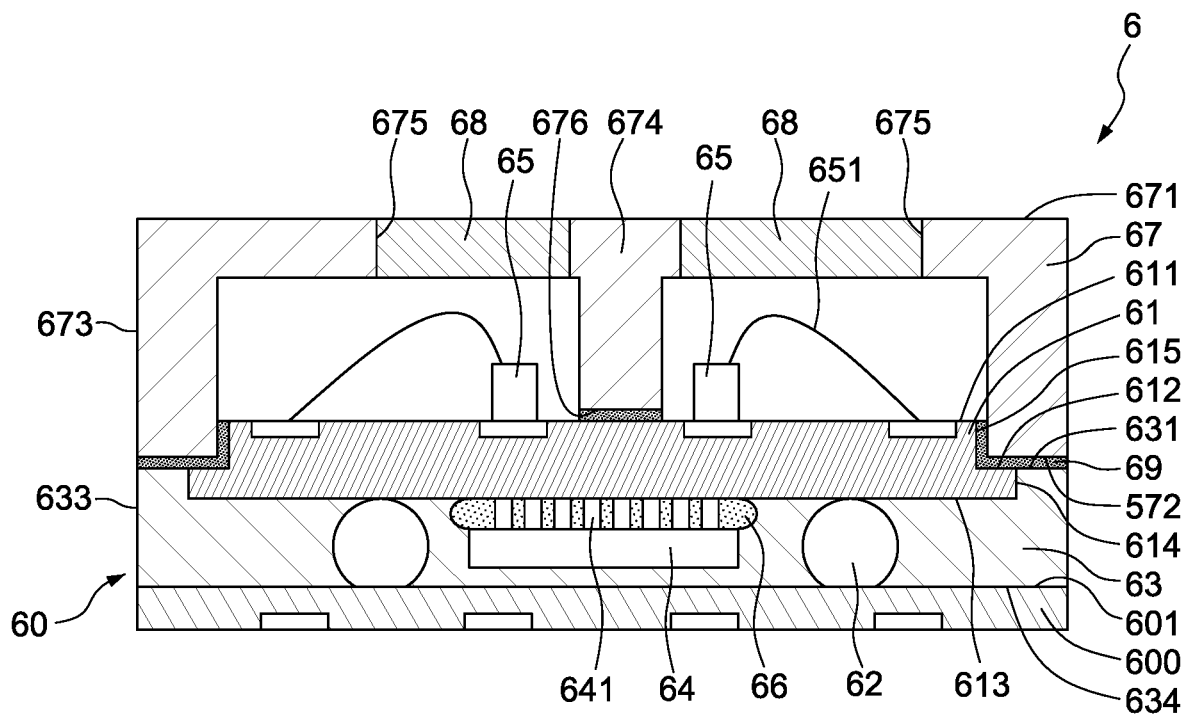
FIG. 12 illustrates a cross-sectional view of an optical device package in accordance with some embodiments of the present disclosure.

FIG. 12 illustrates a cross-sectional view of an optical device package 6 in accordance with some embodiments of the present disclosure. The optical device package 6 shown in FIG. 11 is similar in certain respects to the optical device package 6 shown in FIG. 12, except that in FIG. 11, a substrate 600 is attached to the surface 634 of the encapsulant 63, which is opposite the surface 631 of the encapsulant 63, and electrically connected to the electrical connections 62. In addition, the electrical connections 62 may not be exposed. Thus, in at least some embodiments, the optical device package 6 further comprises a substrate 600, and the encapsulant 63 encapsulates the surface 613 and the side surface 614 of the redistribution structure 61, the surface 601 of the substrate 600 and the electrical connections 62.

Figure 13:
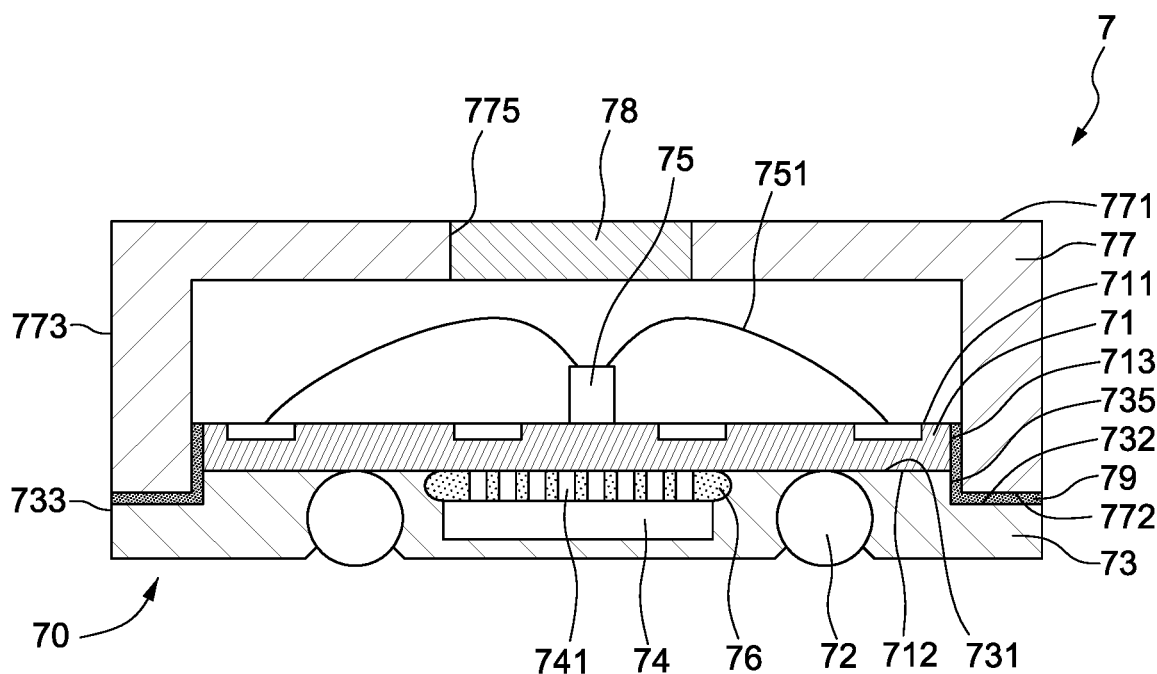
FIG. 13 illustrates a cross-sectional view of an optical device package in accordance with some embodiments of the present disclosure.

FIG. 13 illustrates a cross-sectional view of an optical device package 7 in accordance with some embodiments of the present disclosure. The optical device package 7 comprises a carrier 70 and a lid 77. In some embodiments, the carrier 70 may include ceramic material or a metal plate. In some embodiments, the carrier 70 may be a substrate, an organic substrate or a leadframe. In some embodiment, the carrier 70 may include a plurality of traces. The carrier 70 illustrated in FIG. 13 comprises a redistribution structure 71, electrical connections 72, an encapsulant 73, a semiconductor device 74, an optical element 75 and an under-fill layer 76.

The redistribution structure 71 has a surface 711 and a surface 712 opposite the surface 711. At least one of the electrical connections 72 is on the surface 712 of the redistribution structure 71. The encapsulant 73 encapsulates the surface 712 of the redistribution structure 71 and the electrical connections 72. A portion of each electrical connection 72 is exposed by the encapsulant 73. In addition, the redistribution structure 71 has a side surface 713, and some plating lines may be exposed on the side surface 713.

The semiconductor device 74 is mounted on the surface 712 of the redistribution structure 71. The semiconductor device 74 and the redistribution structure 71 are electrically connected by the bumps 741. In some embodiments, the space between the bumps 741 is filled with an under-fill layer 76. The electrical connections 72 surround a periphery of the semiconductor device 74 and are used to fan-out the inputs and outputs of the semiconductor device 74. The optical element 75 (e.g., optical emitter or optical detector) is mounted on and electrically connected to the surface 711 of the redistribution structure 71.

As shown in FIG. 13, the encapsulant 73 encapsulates the surface 712 of the redistribution structure 71 and the electrical connections 72. The encapsulant 73 has a surface 731, a surface 732 recessed with respect to the surface 731 and a side surface 735 connected to the surface 731 and the surface 732. The surface 731 of the encapsulant 73 is substantially attached to the 712 of the redistribution structure 71. The side surface 735 of the encapsulant 73 may be adjacent to the side surface 713 of the redistribution structure 71 and substantially coplanar with the side surface 713 of the redistribution structure 71. Referring to FIG. 13, the surface 732 of the encapsulant 73 is elevationally less than the surface 711 of the redistribution structure 71.

Given the above, referring to FIG. 13, the carrier 70 has a recessed portion at its side, which is formed by the surfaces 713, 732 and 735.

Further, a lid 77 is arranged on the carrier 70. Referring to FIG. 13, the lid 77 is disposed on the surface 732 of the encapsulant 73 by the adhesive 79. The adhesive 79 may be the optical glue and the optical density (OD) value of the optical glue is greater than 3. Especially, as shown in to FIG. 13, the adhesive 79 is substantially arranged on the surface 732 of the encapsulant 73, the side surface 735 of the encapsulant 73, which connects the surface 732 of the encapsulant 73, and the side surface 713 of the redistribution structure 71, which connects the surface 711 of the redistribution structure 71. That is, the adhesive 79 is arranged at the recessed portion of the carrier 70 and is substantially between the lid 77 and carrier 70. Moreover, since the adhesive 79 is arranged at the recessed portion of the carrier 70, the adhesive 79 may not bleed on the surface 711 to cover the wire 751. The wire 751 is not pulled and dragged by the adhesive 79 during the assembly process, e.g., heating or curing process. The lid 77 has a surface 772 supported by the surface 732 of the encapsulant 73. Thus, the surface 772 of the lid 77 is elevationally less than the surface 731 of the encapsulant 73 and the surface 711 of the redistribution structure 71. In other words, the surface 772 of the lid 77 and the surface 731 of the encapsulant 73 and the surface 711 of the redistribution structure 71 are disposed in different elevations. In some embodiments, the surface 773 of the lid 77 and the side surface 733 of the encapsulant 73 may not be coplanar with each other.

The lid 77 has an aperture 775 at its top and the aperture 775 is substantially aligned with the optical element 75. A filter material 78 is arranged within the aperture 775. Moreover, since the lid 77 may be formed by injection molding, the roughness of the outer surface of the lid 77 may be substantially unified. That is, the roughness of the side surface 773 of the lid 77 may be identical to the roughness of the top surface 771 of the lid 77.

Figure 14:
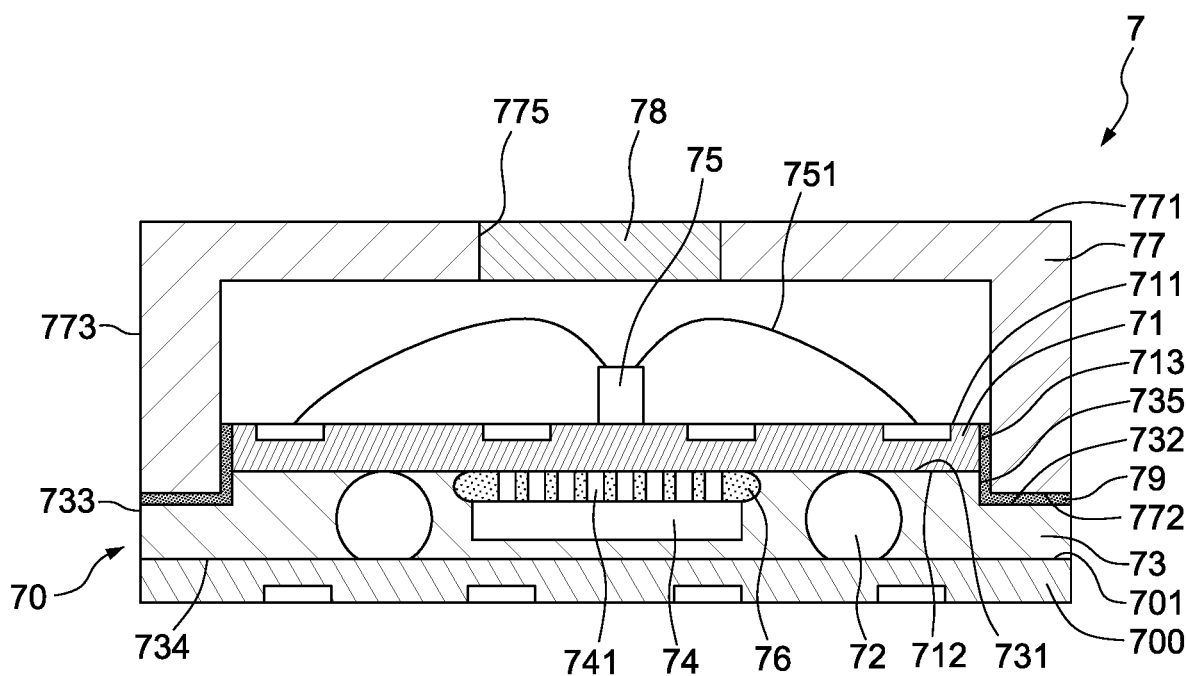
FIG. 14 illustrates a cross-sectional view of an optical device package in accordance with some embodiments of the present disclosure.

FIG. 14 illustrates a cross-sectional view of an optical device package 7 in accordance with some embodiments of the present disclosure. The optical device package 7 shown in FIG. 14 is similar in certain respects to the optical device package 7 shown in FIG. 13, except that in FIG. 14, a substrate 700 is attached to the surface 734 of the encapsulant 73, which is opposite the surfaces 731 and 732 of the encapsulant 73, and electrically connected to the electrical connections 72. In addition, the electrical connections 72 may not be exposed. Thus, in at least some embodiments, the optical device package 7 further comprises a substrate 700, and the encapsulant 73 encapsulates the surface 712 of the redistribution structure 71, the surface 701 of the substrate 700 and the electrical connections 72.

Figure 15:
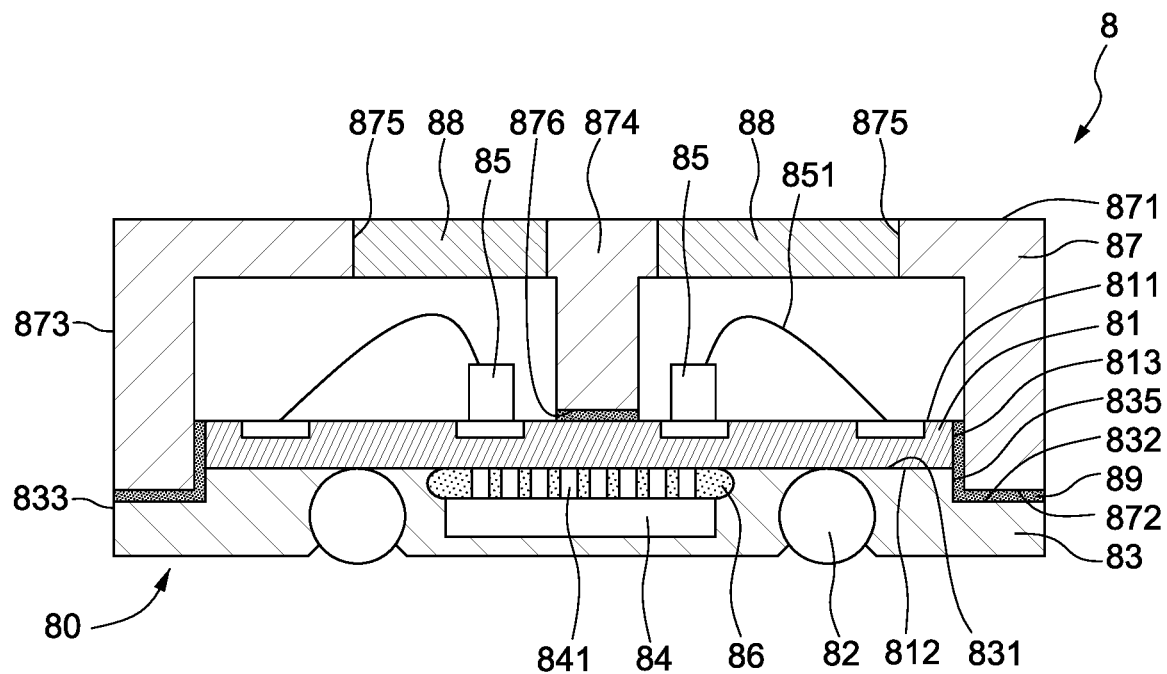
FIG. 15 illustrates a cross-sectional view of an optical device package in accordance with some embodiments of the present disclosure.

FIG. 15 illustrates a cross-sectional view of an optical device package 8 in accordance with some embodiments of the present disclosure. The optical device package 8 comprises a carrier 80 and a lid 87. In some embodiments, the carrier 80 may include ceramic material or a metal plate. In some embodiments, the carrier 80 may be a substrate, an organic substrate or a leadframe. In some embodiment, the carrier 80 may include a plurality of traces. The carrier 80 illustrated in FIG. 15 comprises a redistribution structure 81, electrical connections 82, an encapsulant 83, a semiconductor device 84, optical elements 85 and an under-fill layer 86.

The redistribution structure 81 has a surface 811 and a surface 812 opposite the surface 811. At least one of the electrical connections 82 is on the surface 812 of the redistribution structure 81. The encapsulant 83 encapsulates the surface 812 of the redistribution structure 81 and the electrical connections 82. A portion of each electrical connection 82 is exposed by the encapsulant 83. In addition, the redistribution structure 81 has a side surface 813, and some plating lines may be exposed on the side surface 813.

The semiconductor device 84 is mounted on the surface 812 of the redistribution structure 81. The semiconductor device 84 and the redistribution structure 81 are electrically connected by the bumps 841. In some embodiments, the space between the bumps 841 is filled with an under-fill layer 86. The electrical connections 82 surround a periphery of the semiconductor device 84 and are used to fan-out the inputs and outputs of the semiconductor device 84. The optical elements 85 are mounted on and electrically connected to the surface 811 of the redistribution structure 81. Regarding these two optical elements 85, they may be two optical emitters or two optical detectors or one is an optical emitter and the other is an optical detector.

As shown in FIG. 15, the encapsulant 83 encapsulates the surface 812 of the redistribution structure 81 and the electrical connections 82. The encapsulant 83 has a surface 831, a surface 832 recessed with respect to the surface 831 and a side surface 833 connected to the surface 831 and the surface 832. The surface 831 of the encapsulant 83 is substantially attached to the 812 of the redistribution structure 81. The side surface 833 of the encapsulant 83 may be adjacent to the side surface 813 of the redistribution structure 81 and substantially coplanar with the side surface 813 of the redistribution structure 81. Referring to FIG. 15, the surface 832 of the encapsulant 83 is elevationally less than the surface 811 of the redistribution structure 81.

Given the above, referring to FIG. 15, the carrier 80 has a recessed portion at its side, which is formed by the surfaces 813, 832 and 835.

Further, a lid 87 is arranged on the carrier 80. Referring to FIG. 15, the lid 87 is disposed on the surface 811 of the redistribution structure 81 and the surface 832 of the encapsulant 83 by the adhesive 89. The adhesive 89 may be the optical glue and the optical density (OD) value of the optical glue is greater than 3. Especially, as shown in to FIG. 15, the adhesive 89 is substantially arranged on the surface 811 of the redistribution structure 81, the surface 832 of the encapsulant 83, the side surface 833 of the encapsulant 83m which connects the surface 832 of the encapsulant 83, and the side surface 813 of the redistribution structure 81, which connects the surface 811 of the redistribution structure 81. That is, the adhesive 89 is arranged at the recessed portion of the carrier 80 and is substantially between the lid 87 and the carrier 80.

Moreover, since the adhesive 89 is arranged at the recessed portion of the carrier 80, the adhesive 89 may not bleed on the surface 811 to cover contact the wire 851. The wire 851 is not pulled and dragged by the adhesive 89 during the assembly process, e.g., heating or curing process. The lid 87 has a surface 872 supported by the surface 832 of the encapsulant 83. Thus, the surface 872 of the lid 87 is elevationally less than the surface 831 of the encapsulant 83 and the surface 811 of the redistribution structure 81. In other words, the surface 872 of the lid 87 and the surface 831 of the encapsulant 83 and the surface 811 of the redistribution structure 81 are disposed in different elevations. In addition, the lid 87 may have an inner wall 874 which isolates the optical elements 85 from each other. The inner wall 874 of the lid 87 has a surface 876 supported by the surface 811 of the redistribution structure 81. Thus, the surface 672 is elevationally less than the surface 876. That is, the surfaces 872 and 876 of the lid 87 are disposed in different elevations. In some embodiments, the surface 873 of the lid 87 and the side surface 835 of the encapsulant 83 may not be coplanar with each other.

The lid 87 has two apertures 875 at its top and each of the apertures 875 is substantially aligned with the optical elements 85. Further, the filter materials 88 are respectively arranged within the aperture 875. Moreover, since the lid 87 may be formed by injection molding, the roughness of the outer surface of the lid 87 may be substantially unified. That is, the roughness of the side surface 873 of the lid 87 may be identical to the roughness of the top surface 871 of the lid 87.

Figure 16:
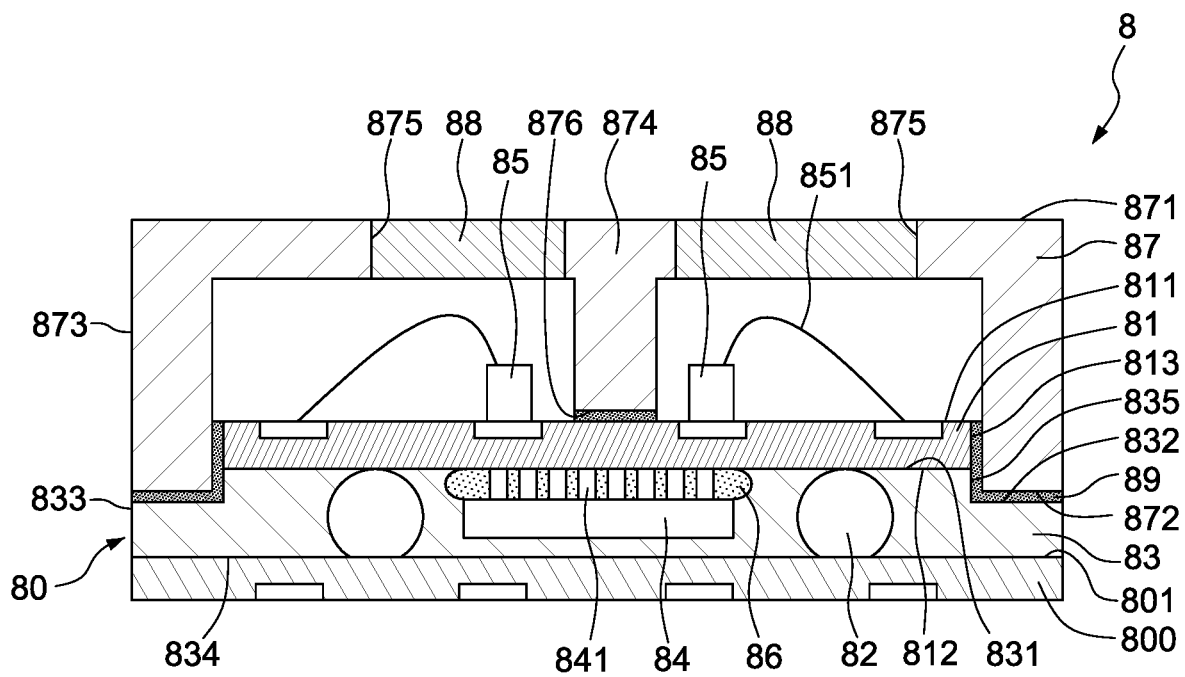
FIG. 16 illustrates a cross-sectional view of an optical device package in accordance with some embodiments of the present disclosure.

FIG. 16 illustrates a cross-sectional view of an optical device package 8 in accordance with some embodiments of the present disclosure. The optical device package 8 shown in FIG. 16 is similar in certain respects to the optical device package 8 shown in FIG. 15, except that in FIG. 16, a substrate 800 is attached to the surface 834 of the encapsulant 83, which is opposite the surfaces 831 and 832 of the encapsulant 83, and electrically connected to the electrical connections 82. In addition, the electrical connections 82 may not be exposed. Thus, in at least some embodiments, the optical device package 8 further comprises a substrate 800, and the encapsulant 83 encapsulates the surface 812 of the redistribution structure 81, the surface 801 of the substrate 800 and the electrical connections 82.

Figure 17A:
FIGS. 17A, 17B, 17C, 17D, 17E, 17F, 17G, 17H, 17I and 17J illustrate one or more stages of a method of manufacturing optical device packages in accordance with some embodiments of the present disclosure.

FIGS. 17A, 17B, 17C, 17D, 17E, 17F, 17G, 17H, 17I and 17J illustrate one or more stages of a method of manufacturing optical device packages 2 in accordance with some embodiments of the present disclosure. FIG. 17A illustrates substrates (e.g., redistribution structures) 21 that have been processed through stages of: baking substrate strip.

Figure 17B:
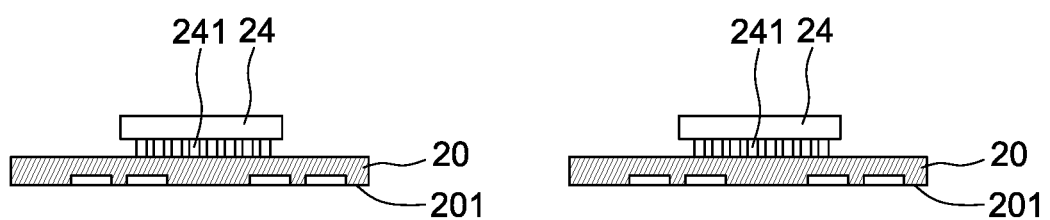

As shown in FIG. 17B, the following stages are then performed to the substrates 21: mounting dies 24 onto the surfaces 212 of the substrates 21 by flip-chip (FC) bonding.

Figure 17C:
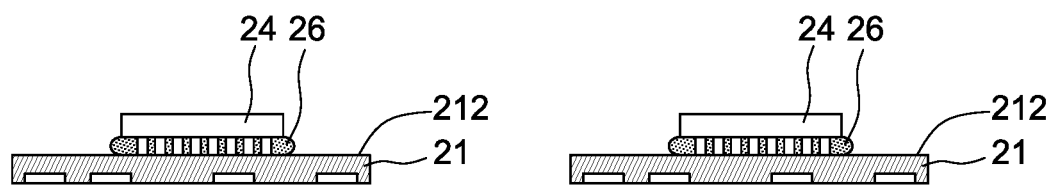

As shown in FIG. 17C, the following stages are then performed to the substrates 21: dispersing under-fill (UF) 26; and curing the UF 26.

Figure 17D:
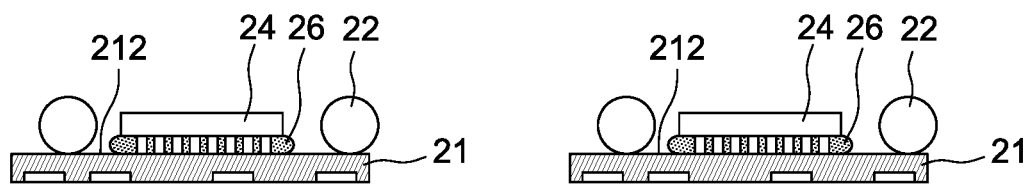

As shown in FIG. 17D, the following stages are then performed to the substrates 21: mounting electrical connections 22 onto the surfaces 212 of the substrates 21 the substrate.

Figure 17E:
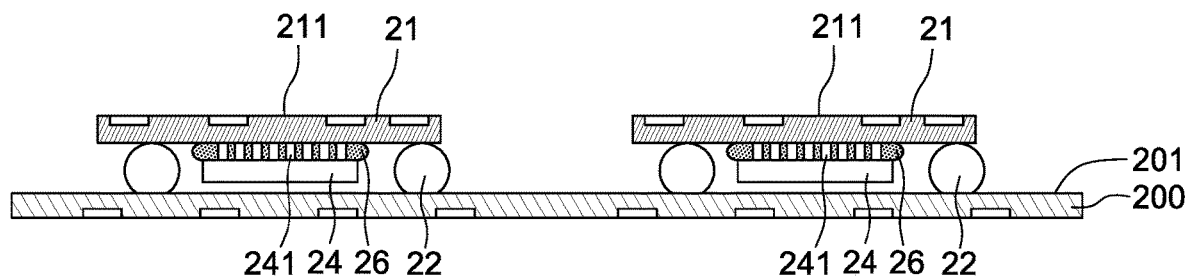

As shown in FIG. 17E, a substrate 200 is attached to and connected to the electrical connections 22.

Figure 17F:
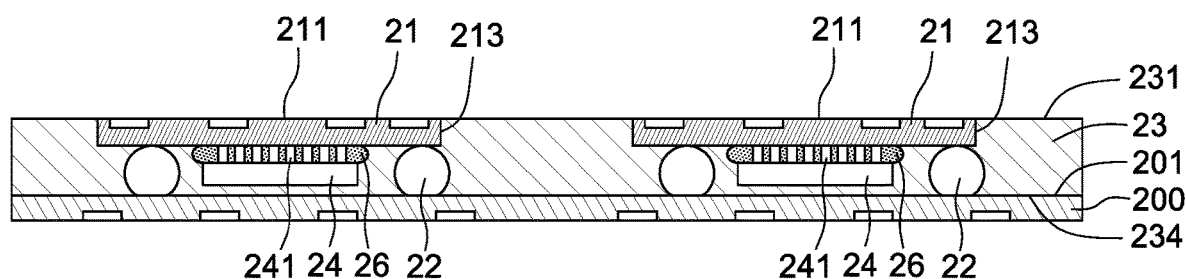

As shown in FIG. 17F, a film-type molding compound (e.g., encapsulant) 23 is applied on the substrates 21, the substrates 200, the electrical connections 22 and the dies 24. Thus, the encapsulant 23 encapsulates the side surfaces 213 and the surfaces 212 of the substrates 21, the surface 201 the substrate 200 and the electrical connections 22 and the dies 24. The encapsulant 23 has a surface 231, wherein the surface 231 may be substantially coplanar with surfaces 211 of the substrates 21, which are opposite the surfaces 212 of the substrates 21.

Figure 17G:
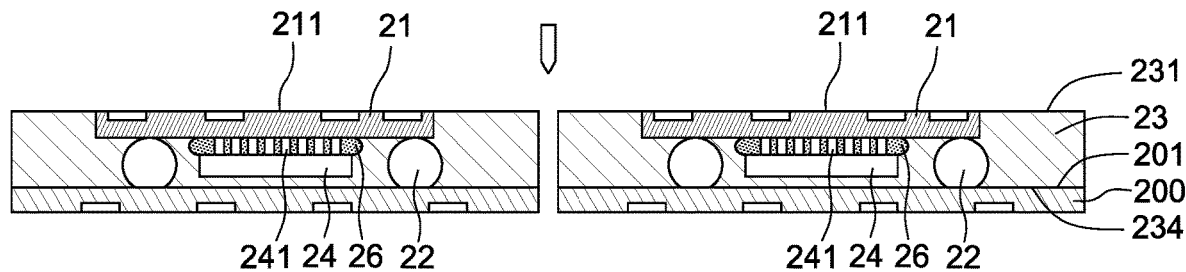

As shown in FIG. 17G, the following stages are then performed to the substrates 21: cutting the substrate 200 and the encapsulant 23.

Figure 17H:
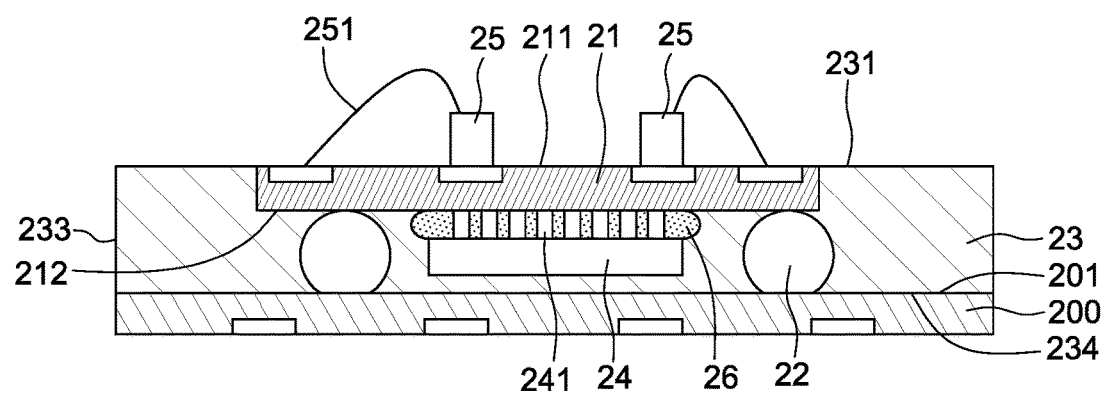

As shown in FIG. 17H, two optical elements 25 are mounted onto the surface 211 of the redistribution structure 21. Regarding these two optical elements 25, they may be two optical emitters or two optical detectors or one is an optical emitter and the other is an optical detector.

Figure 17I:
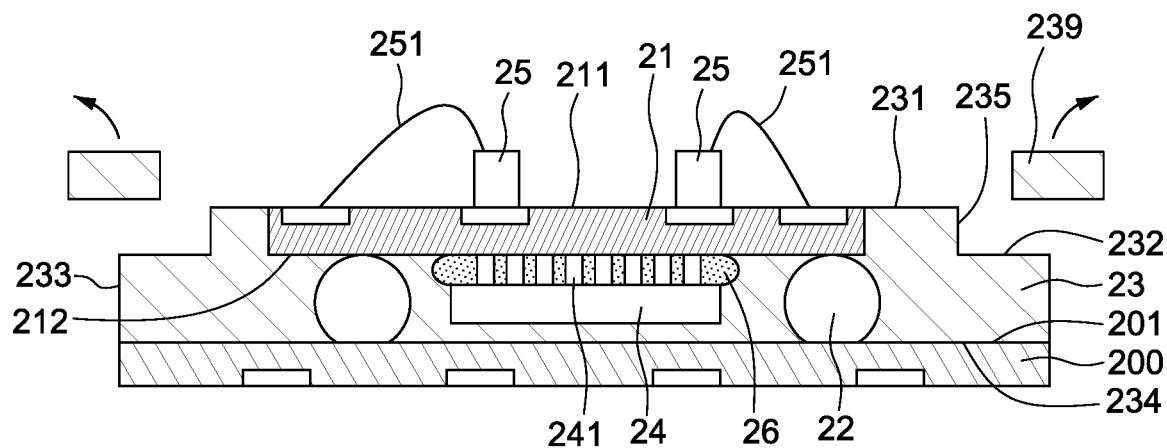

As shown in FIG. 17I, a portion of the encapsulant 239 is removed. Thus, the encapsulant 23 has a surface 232 adjacent to the side surface 233 of the encapsulant 23 and recessed with respect to the surface 231 of the encapsulant 23.

Figure 17J:
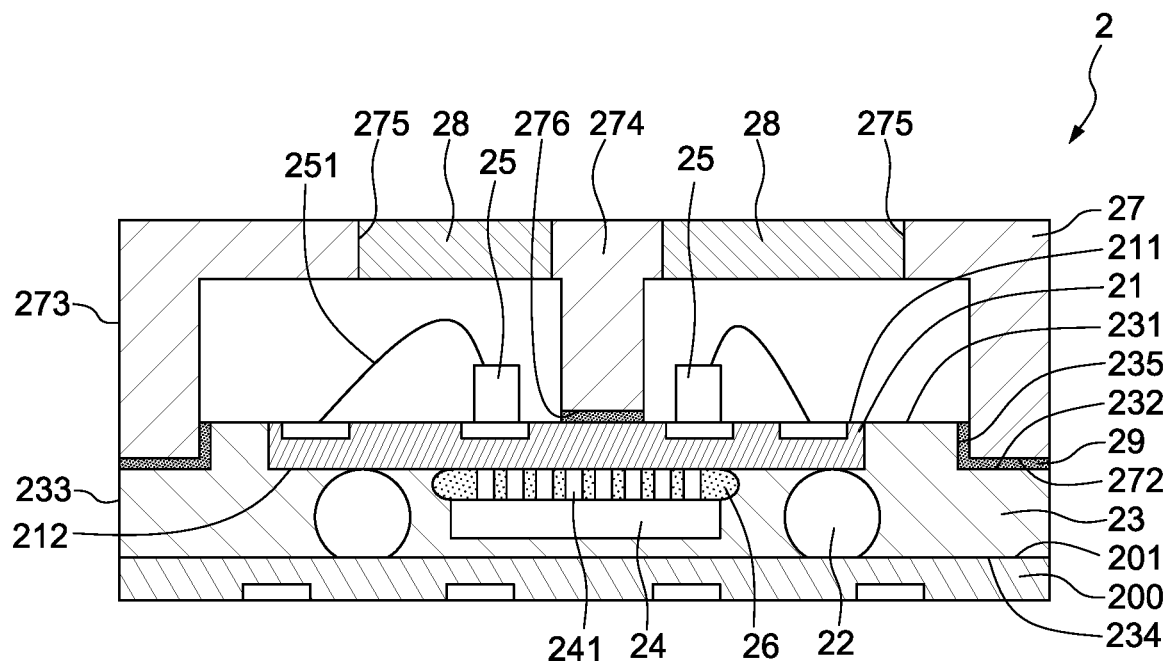

As shown in FIG. 17J, a lid 27, which may be formed by injection molding, is disposed on the surface 211 of the redistribution structure 21 and the surface 232 of the encapsulant 23 by the adhesive 29. The adhesive 29 may be the optical glue and the optical density (OD) value of the optical glue is greater than 3. Moreover, the apertures 275 of the lid 27 are substantially aligned with the optical elements 25. Further, the lid 27 is formed before the lid 27 is disposed on the surface 211 of the redistribution structure 21 and the surface 232 of the encapsulant 23, and thus the side surface 273 of the lid 27 may not be coplanar with the side surface 233 of the encapsulant 23. FIG. 17J shows the optical device packages 2 in accordance with some embodiments of the present disclosure.

Figure 18A:
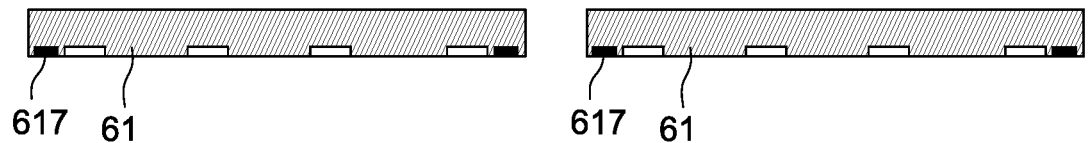
FIGS. 18A, 18B, 18C, 18D, 18E, 18F, 18G, 18H, 18I and 18J illustrate one or more stages of a method of manufacturing optical device packages in accordance with some embodiments of the present disclosure.

FIGS. 18A, 18B, 18C, 18D, 18E, 18F, 18G, 18H, 18I and 18J illustrate one or more stages of a method of manufacturing optical device packages 6' in accordance with some embodiments of the present disclosure. FIG. 18A illustrates substrates (e.g., redistribution structures) 61 that have been processed through stages of: baking substrate strip. Further, the substrate 61 comprises plating lines 617.

Figure 18B:
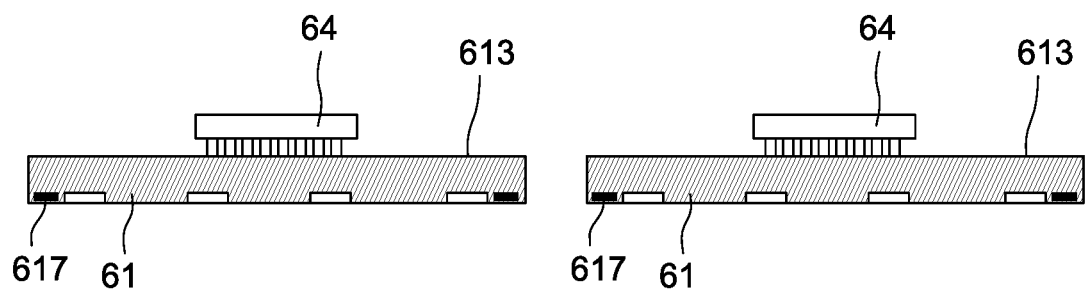

As shown in FIG. 18B, the following stages are then performed to the substrates 61: mounting dies 64 onto the surfaces 613 of the substrates 61 by flip-chip (FC) bonding.

Figure 18C:
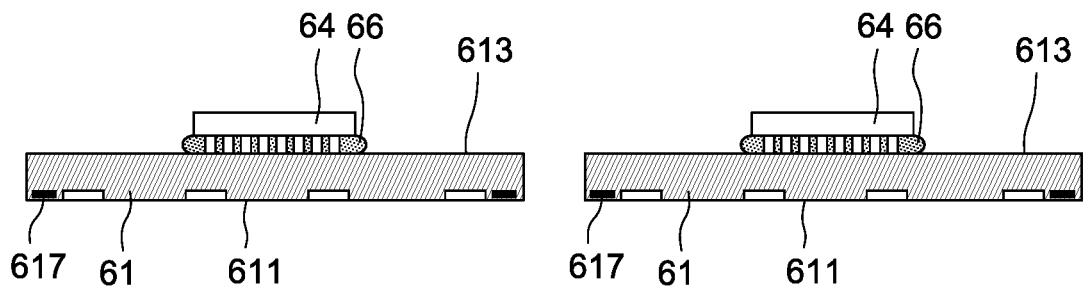

As shown in FIG. 18C, the following stages are then performed to the substrates 61: dispersing under-fill (UF) 66; and curing the UF 66.

Figure 18D:
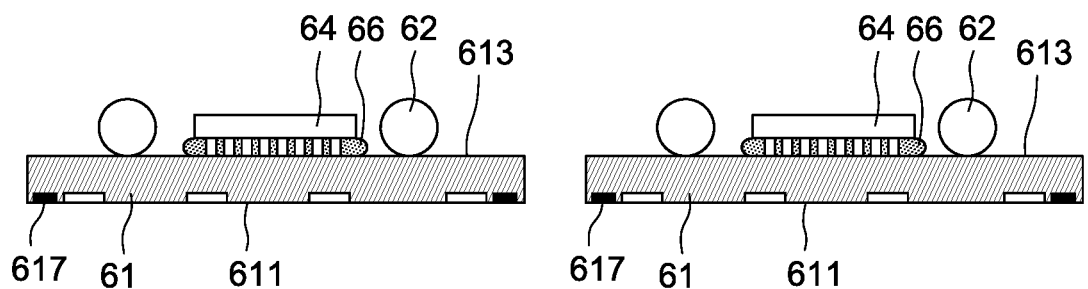

As shown in FIG. 18D, the following stages are then performed to the substrates 61: mounting electrical connections 62 onto the surfaces 613 of the substrates 61 the substrate.

Figure 18E:
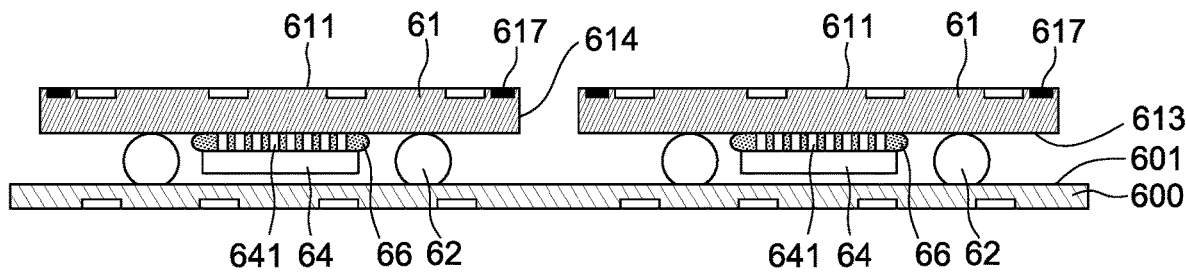

As shown in FIG. 18E, a substrate 600 is attached to and connected to the electrical connections 62.

Figure 18F:
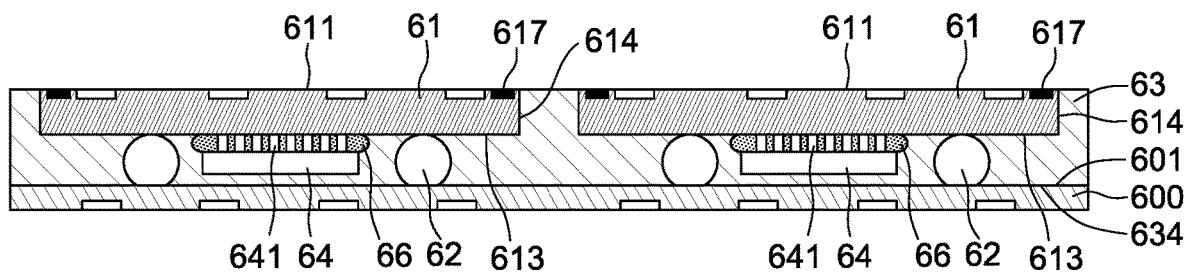

As shown in FIG. 18F, a film-type molding compound (e.g., encapsulant) 63 is applied on the substrates 61, the substrates 600, the electrical connections 62 and the dies 64. Thus, the encapsulant 63 encapsulates the side surfaces 614 and the surfaces 613 of the substrates 61, the surface 601 the substrate 600 and the electrical connections 62 and the dies 64.

Figure 18G:
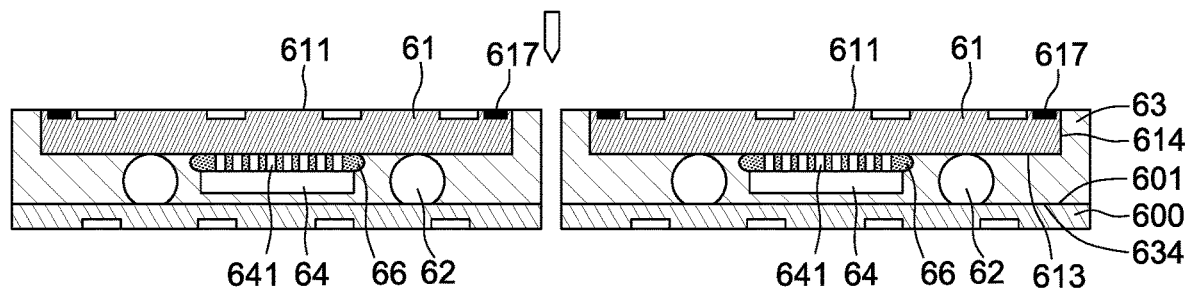

As shown in FIG. 18G, the following stages are then performed to the substrates 61: cutting the substrate 600 and the encapsulant 63.

Figure 18H:
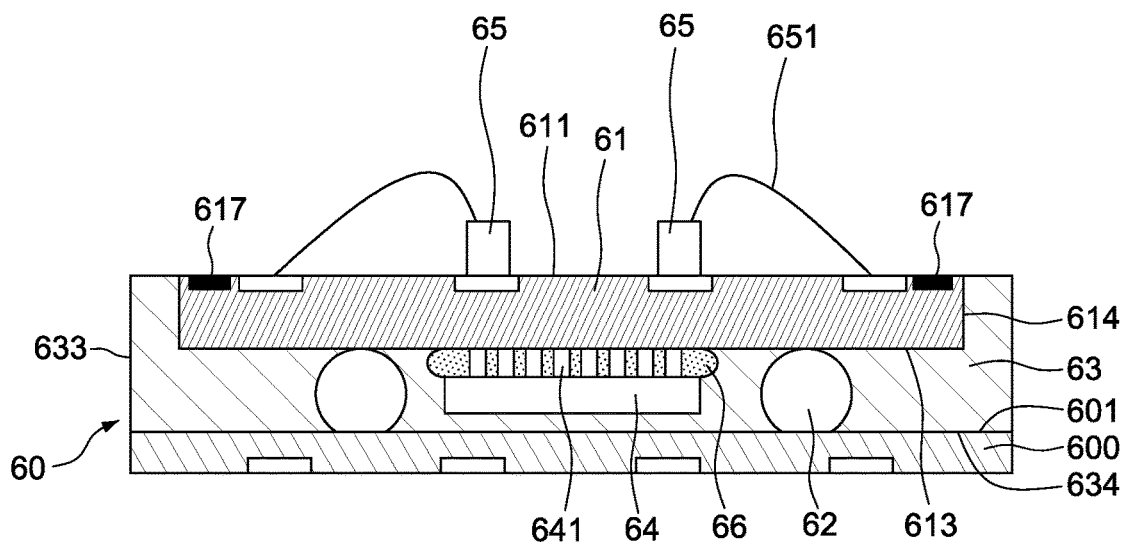

As shown in FIG. 18H, two optical elements 65 are mounted onto the surface 611 of the redistribution structure 61. Regarding these two optical elements 65, they may be two optical emitters or two optical detectors or one is an optical emitter and the other is an optical detector.

Figure 18I:
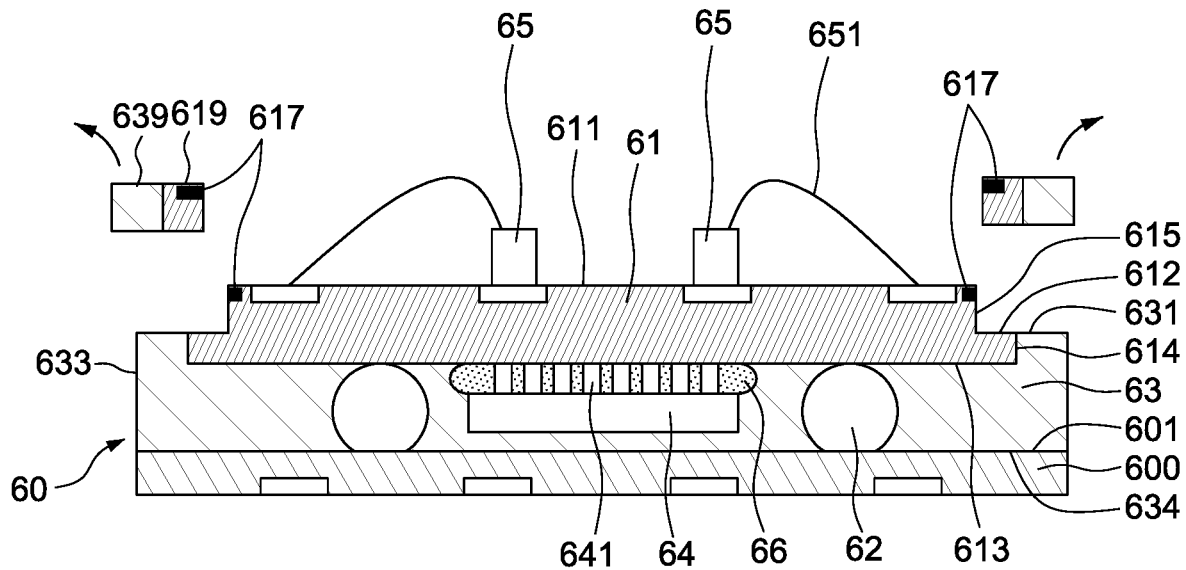

As shown in FIG. 18I, a portion of the encapsulant 639 and a portion of the substrate (redistribution structure) 619 are removed. Thus, the redistribution structure 61 has a surface 612 recessed with respect to the surface 611 and a surface 615 connecting the surfaces 611 and 612 and the encapsulant 63 has a surface 631 substantially coplanar with the surface 612 of the redistribution structure 61. Moreover, since a portion of the substrate (redistribution structure) 619 is removed, the plating lines 617 may be exposed on the surface 615 of the redistribution structure 61.

Figure 18J:
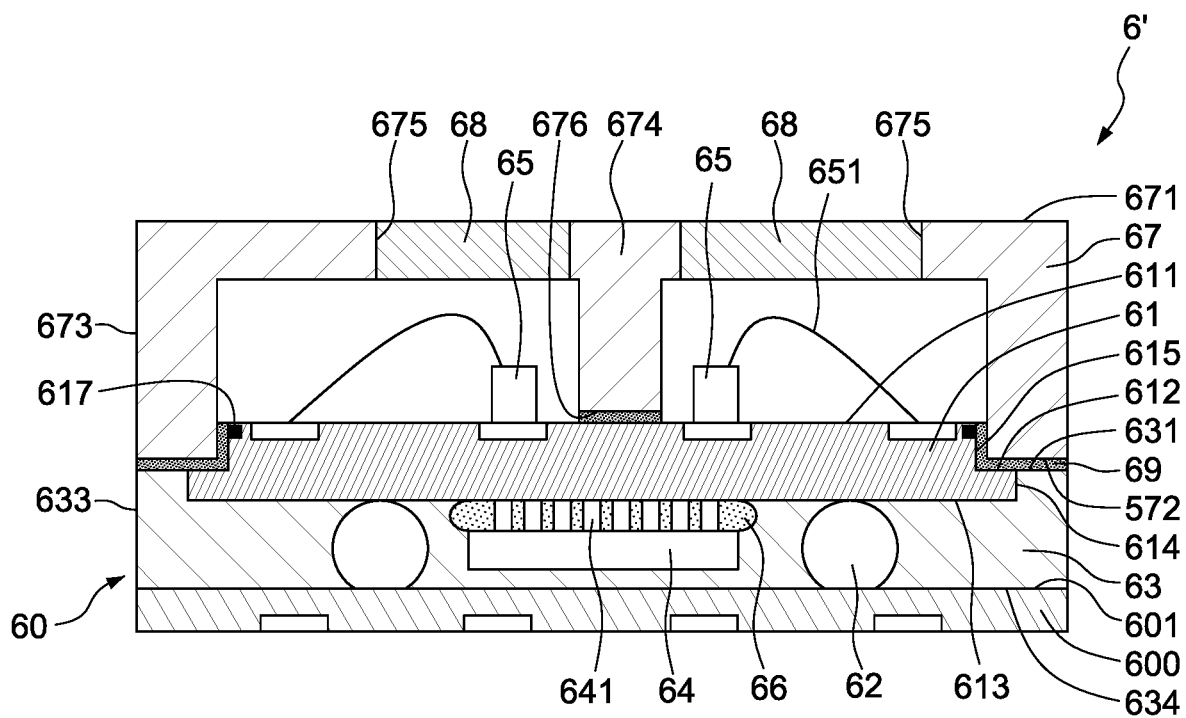

As shown in FIG. 18J, a lid 67, which may be formed by injection molding, is disposed on the surface 612 of the redistribution structure 61 and the surface 631 of the encapsulant 63 by the adhesive 69. The adhesive 69 may be the optical glue and the optical density (OD) value of the optical glue is greater than 3. Moreover, the apertures 675 of the lid 67 are substantially aligned with the optical elements 65. Further, the lid 67 is formed before the lid 67 is disposed on the surface 612 of the redistribution structure 61 and the surface 631 of the encapsulant 63, and thus the side surface 673 of the lid 67 may not be coplanar with the side surface 633 of the encapsulant 63. FIG. 18J shows the optical device packages 6' in accordance with some embodiments of the present disclosure.

As used herein, relative terms, such as "inner," "interior," "outer," "exterior," "top," "bottom," "front," "back," "upper," "upwardly," "lower," "downwardly," "vertical," "vertically," "lateral," "laterally," "above," and "below," refer to an orientation of a set of components with respect to one another; this orientation is in accordance with the drawings, but is not required during manufacturing or use.

As used herein, the singular terms "a," "an," and "the" may include plural referents unless the context clearly dictates otherwise.

As used herein, the terms "connect," "connected," and "connection" refer to an operational coupling or linking. Connected components can be directly or indirectly coupled to one another, for example, through another set of components.

As used herein, the terms "conductive," "electrically conductive" and "electrical conductivity" refer to an ability to transport an electric current. Electrically conductive materials typically indicate those materials that exhibit little or no opposition to the flow of an electric current. One measure of electrical conductivity is Siemens per meter (S/m). Typically, an electrically conductive material is one having a conductivity greater than approximately $10^4$ S/m, such as at least $10^5$ S/m or at least $10^6$ S/m. The electrical conductivity of a material can sometimes vary with temperature. Unless otherwise specified, the electrical conductivity of a material is measured at room temperature.

As used herein, the terms "approximately," "substantially" "substantial," and "about" refer to a considerable degree or extent. When used in conjunction with an event or situation, the terms can refer to instances in which the event or situation occurs precisely as well as instances in which the event or situation occurs to a close approximation, such as when accounting for typical tolerance levels of the manufacturing methods described herein. For example, when used in conjunction with a numerical value, the terms can refer to a range of variation less than or equal to +/−10% of that numerical value, such as less than or equal to +/−5%, less than or equal to +/−4%, less than or equal to +/−3%, less than or equal to +/−2%, less than or equal to +/−1%, less than or equal to +/−0.5%, less than or equal to +/−0.1%, or less than or equal to +/−0.05%. For example, two numerical values can be deemed to be "substantially" the same or equal if a difference between the values is less than or equal to +/−10% of an average of the values, such as less than or equal to +/−5%, less than or equal to +/−4%, less than or equal to +/−3%, less than or equal to +/−2%, less than or equal to +/−1%, less than or equal to +/−0.5%, less than or equal to +/−0.1%, or less than or equal to +1-0.05%.

Two surfaces can be deemed to be coplanar or substantially coplanar if a displacement between the two surfaces is no greater than 5 μm, no greater than 2 μm, no greater than 1 μm, or no greater than 0.5 μm.

A surface can be deemed to be planar or substantially planar if a difference between a highest point and a lowest point on the surface is no greater than 5 μm, no greater than 2 μm, no greater than 1 μm, or no greater than 0.5 μm.

Additionally, amounts, ratios, and other numerical values are sometimes presented herein in a range format. It is understood that such range formats are used for convenience and brevity, and should be interpreted flexibly to include numerical values explicitly specified as limits of a range, as well as all individual numerical values or sub-ranges encompassed within that range, as if each numerical value and sub-range is explicitly specified.

In the description of some embodiments, a component provided "on" or "over" another component can encompass cases where the former component is directly on (e.g., in physical contact with) the latter component, as well as cases where one or more intervening components are located between the former component and the latter component.

While the present disclosure has been described and illustrated with reference to specific embodiments thereof, these descriptions and illustrations do not limit the present disclosure. It should be understood by those skilled in the art that various changes may be made and equivalents may be substituted without departing from the true spirit and scope of the present disclosure as defined by the appended claims.

The construction and arrangement of the structures and methods as shown in the various example embodiments are illustrative only. Accordingly, all such modifications are intended to be included within the scope of the present disclosure. The order or sequence of any process or method steps may be varied or re-sequenced according to alternative embodiments. Other substitutions, modifications, changes, and omissions may be made in the design, operating conditions and arrangement of the example embodiments without departing from the scope of the present disclosure.

What is claimed is:

1. An optical device package, comprising:
   a carrier;
   an optical element disposed on an upper surface of the carrier;
   a lid disposed on the upper surface of the carrier; and
   an adhesive between the lid and the carrier;
   wherein at least a portion of the adhesive is below the optical element;
   wherein the upper surface of the carrier comprises a first portion and a second portion recessed with respect to the first portion, and wherein the adhesive is disposed on the second portion of the upper surface of the carrier.

2. The optical device package of claim 1, wherein a portion of the adhesive is between the lid and the optical element.

3. The optical device package of claim 1, wherein the adhesive is in contact with an inner sidewall of the lid.

4. The optical device package of claim 1, wherein a lateral surface of the adhesive is substantially coplanar with a lateral surface of the lid.

5. The optical device package of claim 4, wherein the lateral surface of the adhesive is substantially aligned with a lateral surface of the carrier.

6. The optical device package of claim 1, wherein an elevation of a top surface of the adhesive is higher than an elevation of a bottom surface of the lid.

7. The optical device package of claim 1, wherein a portion of the adhesive is between the lid and the optical element, and wherein the adhesive is in contact with an inner sidewall of the lid, and wherein a lateral surface of the adhesive is substantially coplanar with a lateral surface of the lid, and wherein an elevation of a top surface of the adhesive is higher than an elevation of a bottom surface of the lid.

* * * * *